United States Patent
Endo et al.

(10) Patent No.: US 9,329,215 B2
(45) Date of Patent: May 3, 2016

(54) IMPEDANCE MEASUREMENT APPARATUS

(71) Applicant: ADVANTEST CORPORATION, Tokyo (JP)

(72) Inventors: Yuki Endo, Tokyo (JP); Yasuo Furukawa, Tokyo (JP); Tomoaki Ueda, Kyoto (JP)

(73) Assignee: ADVANTEST CORPORATION (JP)

( * ) Notice: Subject to any disclaimer, the term of this patent is extended or adjusted under 35 U.S.C. 154(b) by 122 days.

(21) Appl. No.: 14/319,914

(22) Filed: Jun. 30, 2014

(65) Prior Publication Data

US 2015/0028891 A1    Jan. 29, 2015

(30) Foreign Application Priority Data

Jul. 29, 2013   (JP) .................................. 2013-157019

(51) Int. Cl.
*G01R 27/02*   (2006.01)

(52) U.S. Cl.
CPC ...................................... *G01R 27/02* (2013.01)

(58) Field of Classification Search
CPC .......... H02J 5/005; H02J 17/00; G01S 13/758
USPC ........................... 324/612, 633, 649, 652, 655
See application file for complete search history.

(56) References Cited

U.S. PATENT DOCUMENTS

| | | | |
|---|---|---|---|
| 5,627,476 A * | 5/1997 | Chambers | G01R 27/16 324/649 |
| 6,028,503 A * | 2/2000 | Preishuberpflugl | G06K 7/0008 340/10.4 |
| 2011/0241750 A1* | 10/2011 | Hill | G06K 19/0701 327/306 |
| 2013/0213257 A1 | 8/2013 | Yamamoto | |
| 2014/0091637 A1 | 4/2014 | Endo | |

FOREIGN PATENT DOCUMENTS

| | | |
|---|---|---|
| JP | S61-12551 | 1/1986 |
| JP | S63-131095 | 6/1988 |
| JP | H05-083938 | 4/1993 |
| JP | 2006-060953 | 3/2006 |
| WO | 2012/046535 A1 | 4/2012 |
| WO | 2012/164845 A1 | 12/2012 |

* cited by examiner

*Primary Examiner* — Vincent Q Nguyen
(74) *Attorney, Agent, or Firm* — Cantor Colburn LLP

(57) ABSTRACT

A measurement auxiliary circuit is configured to form a resonance circuit together with a detection target. An ATAC is coupled with the resonance circuit. A signal generator applies an AC probe signal $V_S$ to the resonance circuit. After the impedance measurement apparatus enters a stable state, an impedance detection unit measures a voltage at at least one node and/or a current that flows through at least one current path. The impedance detection unit detects the impedance of the detection target based on the measurement value.

14 Claims, 22 Drawing Sheets

1d

400

500

600

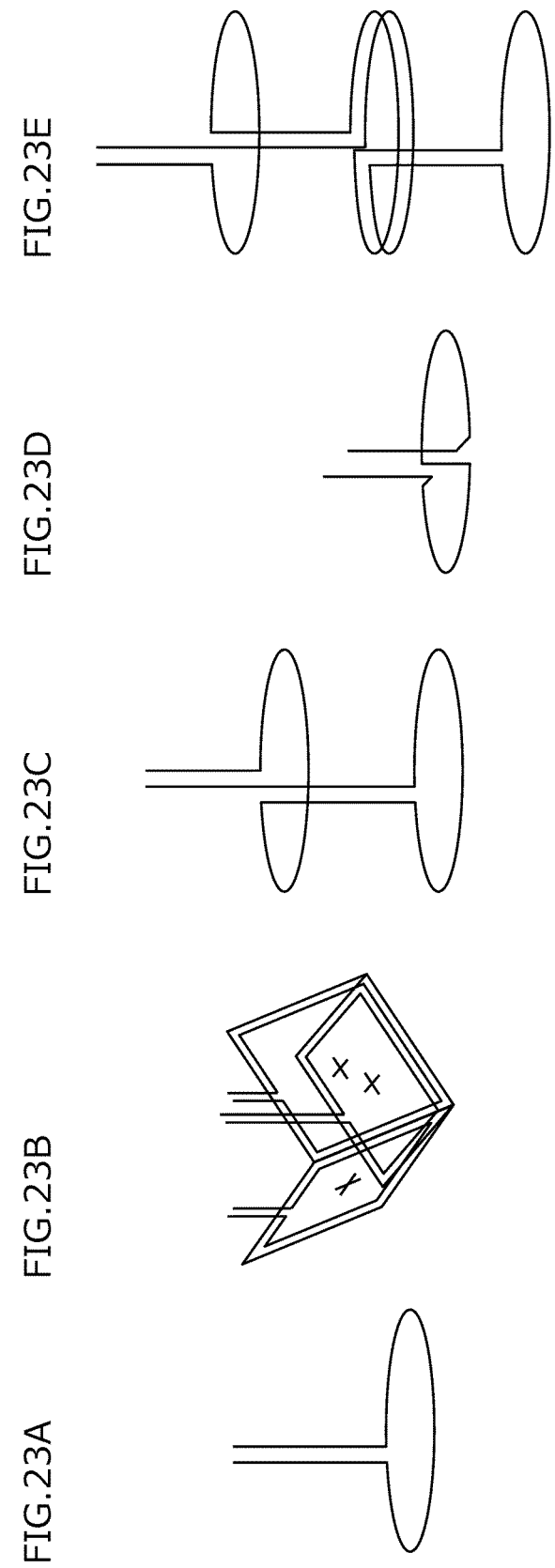

IMPEDANCE MEASUREMENT APPARATUS

CROSS-REFERENCE TO RELATED APPLICATIONS

This application claims priority to Japanese Patent Application No. 2013-157019, filed on Jul. 29, 2013, the disclosure of which is hereby incorporated by reference in its entirety.

BACKGROUND OF THE INVENTION

1. Field of the Invention

The present invention relates to an impedance measurement technique.

2. Description of the Related Art

In order to measure an impedance component such as resistance, capacitance, inductance, or a value accompanying such an impedance component, various kinds of measurement methods are employed, examples of which include the bridge method, the resonance method, the I-V method, the RF I-V method, the network analysis method, and the automatic balancing bridge method. In many cases, commercially available network analyzers and LCR meters employ the network analyzing method or otherwise the automatic balancing bridge method. Such an arrangement provides high-precision measurement. However, as tradeoff problems, such a measurement method leads to a very high cost, and requires a long measurement time.

FIG. 1 is a diagram showing the principle of the resonance method. FIG. 1 shows an example of measurement of the impedance Z of a circuit comprising an inductance Lx and a resistance Rx connected in series. In a case in which the impedance Z to be measured functions as an inductive impedance, a variable capacitor C for tuning is arranged in series with the impedance Z, thereby forming an RLC series resonance circuit. With such an arrangement, an AC measurement signal is applied by means of a signal generator SG between both terminals of the series resonance circuit thus formed. In this state, at least one of the capacitance of the variable capacitor and the frequency of the measurement signal is adjusted so as to tune the circuit to a resonance state.

With such a resonance method, the value of the inductance Lx can be measured based on the capacitance value of the variable capacitor C and the frequency in the resonance state. Furthermore, based on the voltage across both ends of the variable capacitor, the Q value of the circuit, and thus the resistance Rx, can be measured.

RELATED ART DOCUMENTS

Patent Documents

[Patent Document 1]
  Japanese Patent Application Laid Open No. S61-12551
[Patent Document 2]
  Japanese Patent Application Laid Open No. S63-131095
[Patent Document 3]
  Japanese Patent Application Laid Open No. H05-83938
[Patent Document 4]
  International Publication WO 12/164845A1 pamphlet
[Patent Document 5]
  International Publication WO 12/046535A1 pamphlet
[Patent Document 6]
  Japanese Patent Application Laid Open No. 2006-60953

As described above, the resonance method provides an advantage of allowing the measurement apparatus to be formed in a simple manner with a low cost. Furthermore, such a resonance method allows the impedance to be measured with high precision. However, such a resonance method requires a tuning operation, which is a problem.

SUMMARY OF THE INVENTION

The present invention has been made in order to solve such a problem. Accordingly, it is an exemplary purpose of the present invention to provide an impedance measurement apparatus configured to operate without such a troublesome tuning operation.

An embodiment of the preset invention relates to a impedance measurement apparatus configured to measure an impedance of a detection target. The impedance measurement apparatus comprises: a measurement auxiliary circuit configured to form a resonance circuit together with the detection target; an automatic tuning assist circuit coupled with the resonance circuit; a signal generator configured to apply an AC probe signal to the resonance circuit; and an impedance detection unit configured to measure a voltage at at least one node and/or a current that flows through at least one current path after the impedance measurement apparatus enters a stable state, and to detect the impedance of the detection target based on the measurement value. The automatic turning assist circuit comprises: (i) a first terminal and a second terminal; (ii) N (N represents an integer) auxiliary capacitors; (iii) multiple switches, each of which is arranged between two terminals from among the first terminal, the second terminal, and terminals of the N auxiliary capacitors; and (iv) a controller configured to respectively switch each of the multiple switches.

With such an embodiment, the phase of the resonance current that flows through the resonance circuit can be locked at the stabilization point at which it is synchronized with the phase of the switching operation of the multiple switches. Such an arrangement provides a quasi-resonant state even if the frequency of the probe signal does not match the resonance frequency of the resonance circuit. Thus, such an arrangement allows a troublesome tuning operation to be performed automatically. This allows the impedance of the detection target to be measured in a simple manner.

In the present specification, the measurement represented by the phrase "measurement of the impedance of a detection target" includes a measurement of a factor having an effect on the impedance, in addition to the measurement of the impedance of the detection target itself. For example, factors such as the dielectric constant and the distance between electrodes have an effect on the impedance (capacitance value) of a capacitor. Thus, in a case in which the detection target functions as a capacitor circuit, the measurement represented by the phrase "measurement of the impedance" includes the measurement of the dielectric constant, and the measurement of the distance between electrodes. Similarly, factors such as the magnetic permeability, the number of turns of the coil, and the like, have an effect on the impedance (inductance) of an inductor. Thus, in a case in which the detection target function as an inductor circuit, the measurement represented by the phrase "measurement of the impedance" includes the measurement of the magnetic permeability, the measurement of the number of turns of the coil, and detection of the presence or absence of a magnetic material.

It should be noted that any combination of the aforementioned components, any component of the present invention, or any manifestation thereof, may be mutually substituted between a method, apparatus, system, and so forth, which are effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 23A through 23E are diagrams each showing a pickup coil suitable for a magnetic field detection apparatus.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

[Overall Configuration of Impedance Measurement Apparatus 1]

Figure 1:
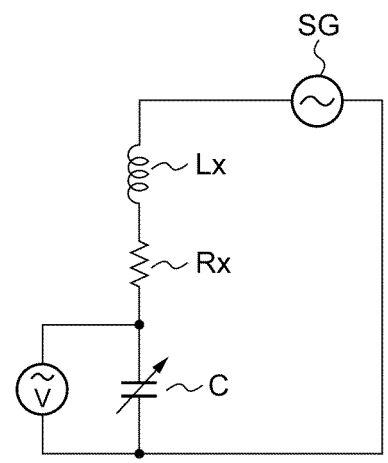
FIG. 1 is a diagram showing the principle of a resonance method.
Figure 2:
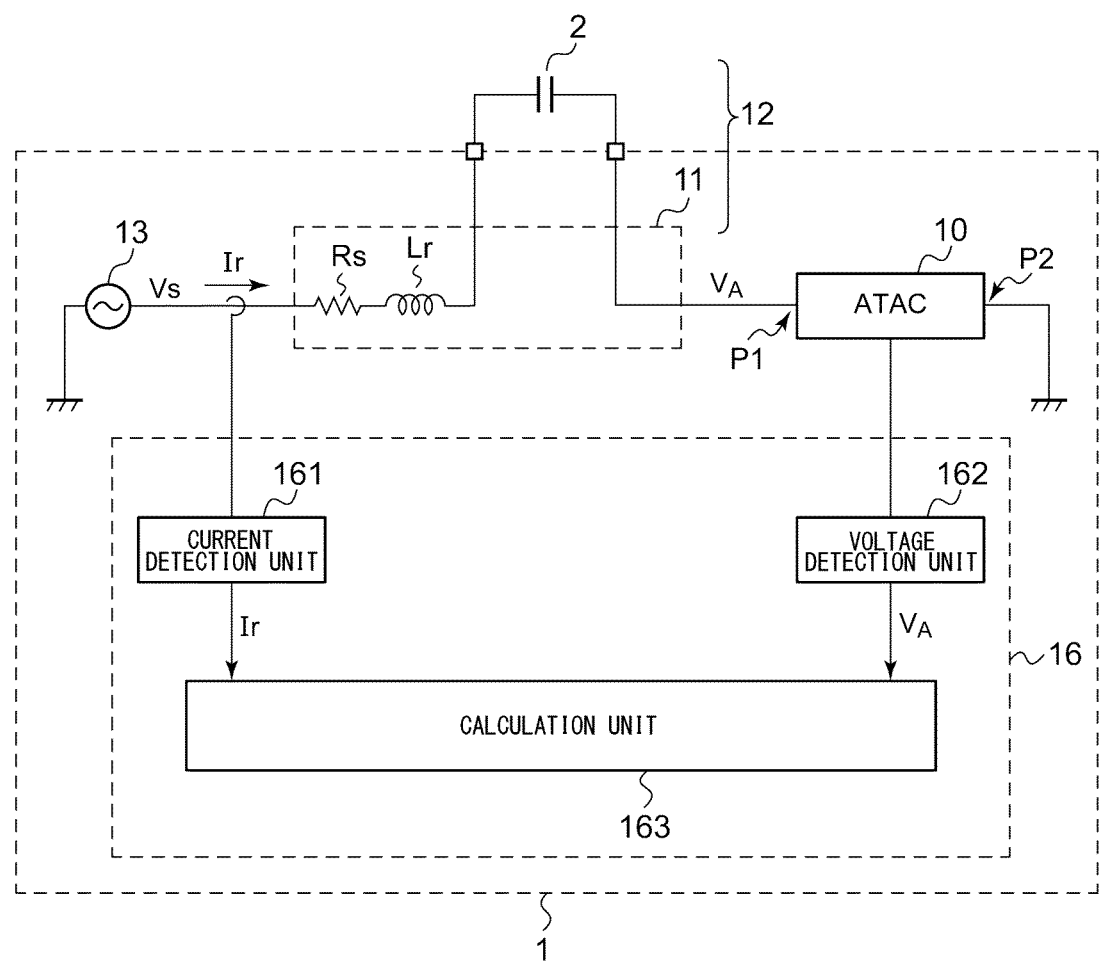
FIG. 2 is a block diagram showing an impedance measurement apparatus according to an embodiment.

FIG. 2 is a block diagram showing an impedance measurement apparatus 1 according to an embodiment. The impedance measurement apparatus 1 measures the impedance of a detection target 2. Examples of the detection target 2 include a circuit element such as a capacitor, an inductor, a resistor, or the like. Description will be made in the present embodiment regarding an arrangement in which the detection target 2 is configured as a capacitor.

The impedance measurement apparatus 1 includes an ATAC 10, a measurement auxiliary circuit 11, a signal generator 13, and an impedance detection unit 16.

The measurement auxiliary circuit 11 is configured to form a resonance circuit 12 together with the detection target 2. Description will be made in the present embodiment regarding an arrangement in which the resonance circuit 12 is configured as an RLC series resonance circuit. However, the topology of the resonance circuit 12 is not restricted in particular. The resonance circuit 12 includes an inductor $L_r$ and a resistor $R_s$ arranged in series with the detection target 2.

The automatic tuning assist circuit (which will be referred to as the "ATAC" hereafter) 10 is coupled in series with the resonance circuit 12. Detailed description will be made later regarding the ATAC 10. The ATAC 10 includes at least one auxiliary capacitor.

The signal generator 13 applies an AC probe signal $V_S$ having a predetermined frequency $f_0$ between both terminals of a circuit comprising the resonance circuit 12 and the ATAC 10. The probe signal $V_S$ may be configured to have a sine waveform. Also, the probe signal $V_S$ may be configured to have a rectangular waveform or a trapezoidal waveform.

When the impedance measurement apparatus 1 is stabilized to a quasi-resonant state as described later, the impedance detection unit 16 measures the voltage at at least one node of the impedance measurement apparatus 1, and detects the impedance of the detection target 2 based on the measured value. Description will be made later regarding the principle of the impedance detection provided by the impedance detection unit 16.

Next, detailed description will be made regarding the ATAC 10. The ATAC 10 can roughly be classified into two types, i.e., a type employing a capacitor (which will be referred to as the "capacitor-type ATAC") and a type employing an inductor (inductor-type ATAC). Description regarding them will be made below.

[Capacitor-type ATAC]

First, description will be made regarding a first example of the impedance measurement apparatus 1 employing a capacitor-type ATAC 10.

Figure 3:
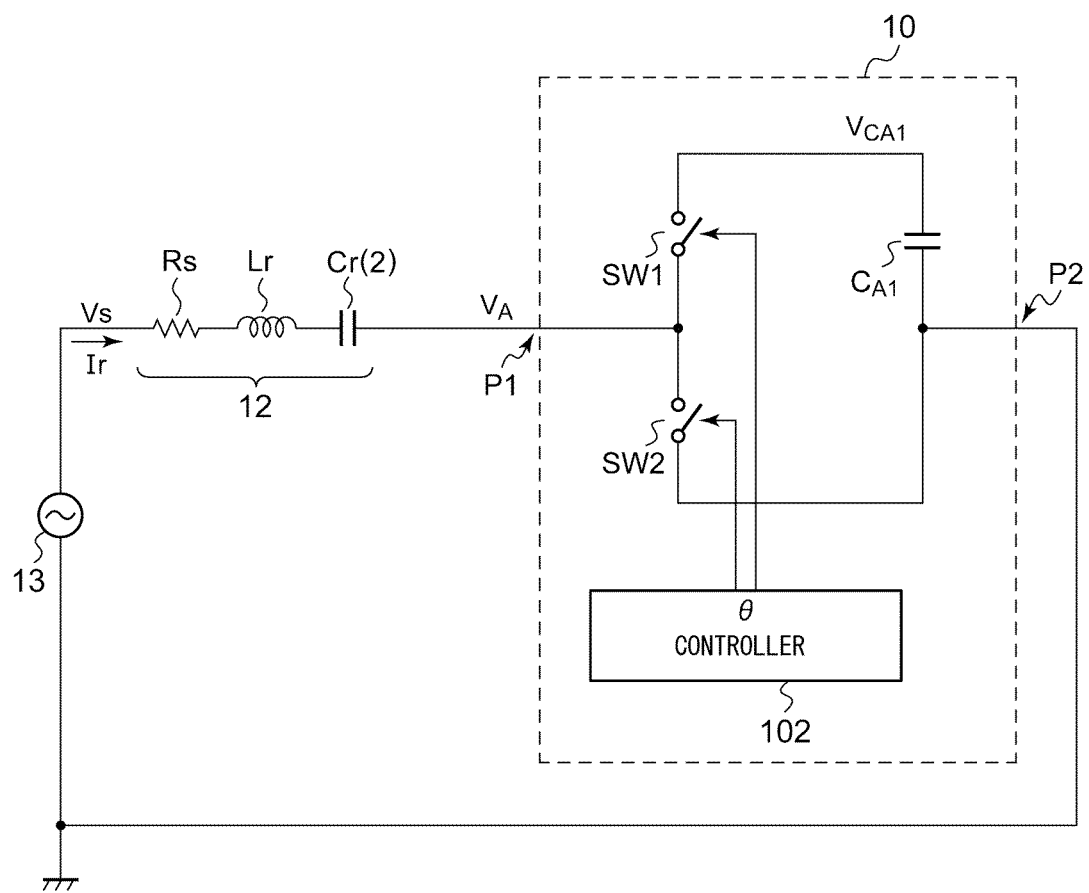
FIG. 3 is a circuit diagram showing an impedance measurement apparatus according to a first example.

FIG. 3 is a circuit diagram showing the impedance measurement apparatus 1 according to the first example.

In FIG. 3, the impedance detection unit 16 is not shown, and "$C_r$" represents the capacitance component of the detection target 2 shown in FIG. 2. In the impedance measurement apparatus 1 shown in FIG. 3, the ATAC 10 includes a first terminal P1, a second terminal P2, a first switch SW1, a second switch SW2, a first auxiliary capacitor $C_{A1}$, and a controller 102. Either one of the first terminal P1 or the second terminal P2 has its electric potential fixed. Description will be made in the present embodiment regarding an arrangement in which the second terminal P2 is grounded and has its electric potential fixed to the ground voltage $V_{GND}$. It should be noted that the node that is to have a fixed electric potential is not restricted to the first terminal P1 or the second terminal P2. A different node may have a fixed electric potential.

The first switch SW1 and the first auxiliary capacitor $C_{A1}$ are arranged in series between the first terminal P1 and the second terminal P2. The first switch SW1 and the first auxiliary capacitor $C_{A1}$ may be mutually exchanged. The second switch SW2 is arranged in parallel with the first switch SW1 and the first auxiliary capacitor $C_{A1}$ between the first terminal P1 and the second terminal P2.

The controller 102 switches on and off the multiple switches SW1 and SW2 with the same frequency $f_0$ as that of the probe signal $V_S$ generated by the signal generator 13 and with a predetermined phase difference θ with respect to the probe signal $V_S$. The phase difference θ is preferably set to a value in the vicinity of 90 degrees. It should be noted that the phase difference θ is not necessarily required to be set to 90 degrees. For ease of understanding and simplification of description, description will be made below regarding an arrangement in which the phase difference θ is set to 90 degrees.

The first switch SW1 and the second switch SW2 are each configured employing a MOSFET (Metal Oxide Semiconductor Field Effect Transistor), IGBT (Insulated Gate Bipolar Transistor), bipolar transistor, or the like. FIGS. 4A through 4F are diagrams each showing an example configuration of a switch employing a MOSFET.

Figure 4A:
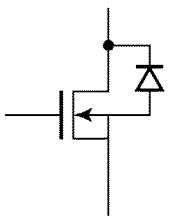
FIGS. 4A through 4F are diagrams each showing an example configuration of a switch employing a MOSFET.
Figure 4B:
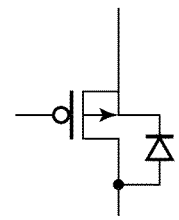
Figure 4C:
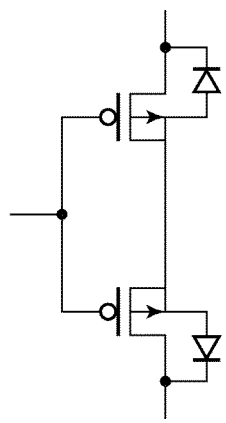
Figure 4D:
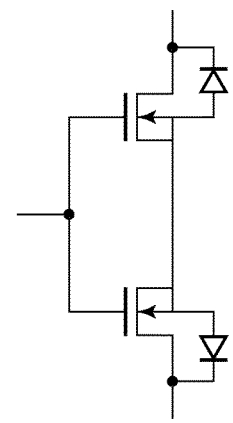
Figure 4E:
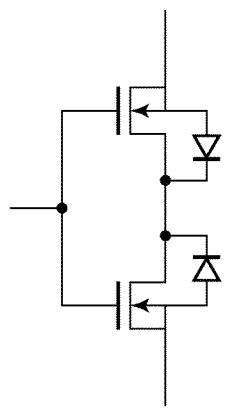
Figure 4F:
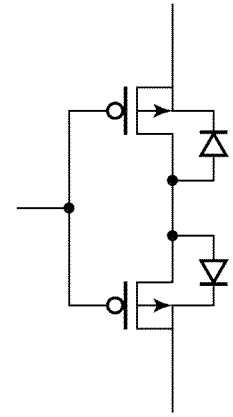

FIG. 4A shows a configuration of the switch employing an N-channel MOSFET. FIG. 4B shows a configuration of the switch employing a P-channel MOSFET. In a case in which the back gate of the MOSFET is connected to its source, the body diode that forms between the back gate and the drain is in the connection state regardless of the gate voltage. Thus, such a switch configured as a single MOSFET is not capable of blocking a current that flows in one particular direction. In the present specification, such a switch will be referred to as a "uni-directional switch".

The switches shown in FIGS. 4C through 4F each comprise two N-channel MOSFETs or otherwise two P-channel MOSFETs connected such that their body diodes are connected in reverse directions (back-to-back connection). With the switches shown in FIGS. 4C through 4F, in the off state, no current flows in either direction. In the present specification, such a switch will be referred to as a "bi-directional switch".

With the present embodiment, the switches SW1 and SW2 may each be configured as a uni-directional switch or otherwise a bi-directional switch. It should be noted that, in a case in which the switches SW1 and SW2 are each configured as a uni-directional switch, there is a need to pay attention to their switching phases. Detailed description thereof will be made later.

[The Operation Principle of Capacitor-type ATAC]

The above is the configuration of the impedance measurement apparatus 1 according to the first example. Next, description will be made regarding the operation principle of the impedance measurement apparatus 1.

The controller 102 switches on and off the first switch SW1 and the second switch SW2 in synchronization with the probe signal $V_S$, and more specifically, performs the switching operation in a complementary manner with the same frequency as that of the probe signal $V_S$ and with a phase difference of θ=90 degrees with respect to the probe signal $V_S$.

In the on time $T_{ON1}$ of the first switch SW1, the resonance current $I_r$ that flows through the resonance circuit 12 flows to the first auxiliary capacitor $C_{A1}$. In the on time $T_{ON2}$ of the second switch SW2, the resonance current $I_r$ flows to the ground via the second switch SW2. That is to say, the first auxiliary capacitor $C_{A1}$ is charged and discharged using the resonance current $I_r$. As a result, the capacitor voltage $V_{CA1}$ is generated at the first auxiliary capacitor $C_{A1}$.

The ATAC 10 can be regarded as a voltage source which applies the voltage (which will be referred to as the "auxiliary voltage" hereafter) $V_A$ generated at its first terminal P1 to the resonance circuit 12. The auxiliary voltage $V_A$ is configured as a signal having an approximately rectangular waveform. In the on period $T_{ON1}$ of the second switch SW2, the auxiliary voltage $V_A$ is set to the first auxiliary capacitor voltage $V_{CA1}$. In the on period $T_{ON2}$ of the second switch SW2, the auxiliary voltage $V_A$ is set to the ground voltage $V_{GND}$.

Figure 5:
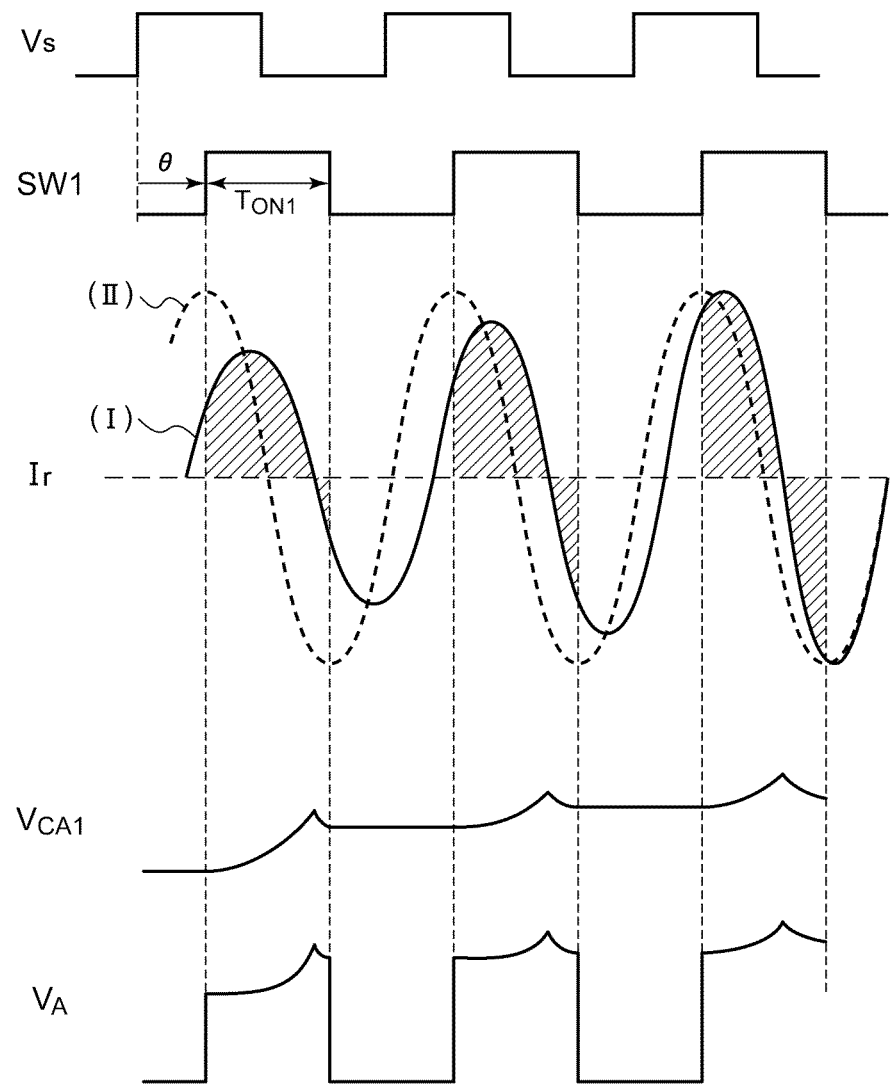
FIG. 5 is an operation waveform diagram showing the impedance measurement apparatus in the transient state and the steady state.

FIG. 5 is an operation waveform diagram showing the operation of the impedance measurement apparatus 1 in the transient state and the steady state. It should be noted that the scales of the vertical axis and the horizontal axis in the waveform diagrams and time charts are expanded or reduced as appropriate for ease of understanding. Also, the waveforms shown in the drawings are simplified for ease of understanding.

The waveform (I) represents the resonance current $I_r$ in the transient state. In the on period $T_{ON1}$ of the switch SW1, the first auxiliary capacitor $C_{A1}$ is charged and discharged by means of the resonance current $I_r$. Specifically, when the resonance current $I_r$ is a positive value in the on period $T_{ON1}$, the first auxiliary capacitor $C_{A1}$ is charged. Conversely, when the resonance current $I_r$ is a negative value in the on period $T_{ON1}$, the first auxiliary capacitor $C_{A1}$ is discharged. As a result, when the period in which the resonance current $I_r$ is a positive value is longer than the period in which the resonance current $I_r$ is a negative value, the capacitor voltage $V_{CA1}$ rises. Conversely, when the period in which the resonance current $I_r$ is a negative value is longer than the period in which the resonance current $I_r$ is a positive value, the capacitor voltage $V_{CA1}$ drops.

Let us say that the capacitor voltage $V_{CA1}$ rises in the on time $T_{ON1}$ of a certain cycle. In this case, the correction voltage $V_A$ is applied to the resonance circuit 12 according to the increased capacitor voltage $V_{CA1}$. This advances the phase of the resonance current $I_r$ with respect to the resonance current $I_r$ of the previous cycle. By repeatedly performing this processing, the capacitor voltage $V_{CA1}$ rises in increments of cycles, which gradually advances the phase of the resonance current $I_r$. Eventually, the phase of the resonance current $I_r$ shifts until it reaches a stabilization point. When the phase of the resonance current $I_r$ exceeds the stabilization point, the discharge current of the first auxiliary capacitor $C_{A1}$ becomes greater than its charging current, thereby providing a feedback control operation in a direction such that the capacitor voltage $V_{CA1}$ drops. Eventually, the capacitor voltage $V_{CA1}$ is returned to the stabilization point. At the stabilization point, such an arrangement provides a balanced state between the charging current and the discharging current for the first auxiliary capacitor $C_{A1}$. In this state, the capacitor voltage $V_{CA1}$ enters an equilibrium state. Thus, as represented by the waveform (II), the state becomes a steady state in which the phase of the resonance current $I_r$ is stabilized.

That is to say, with the impedance measurement apparatus 1 according to the embodiment, such an arrangement allows the phase of the resonance current $I_r$ that flows through the resonance circuit 12 to be locked at the stabilization point at which it is synchronized with the phase of the switching operation of the first switch SW1. With such an arrangement, in a case in which the first switch SW1 is switched on and off with a phase delayed by $\theta=90$ degrees with respect to the probe voltage $V_S$, the phase difference between the probe voltage $V_S$ and the resonance current $I_r$ becomes zero. This means that a quasi-resonance state is established regardless of whether or not the frequency $f_0$ of the probe voltage $V_S$ generated by the signal generator 13 matches the resonance frequency fr of the measurement auxiliary circuit 11.

Figure 6:
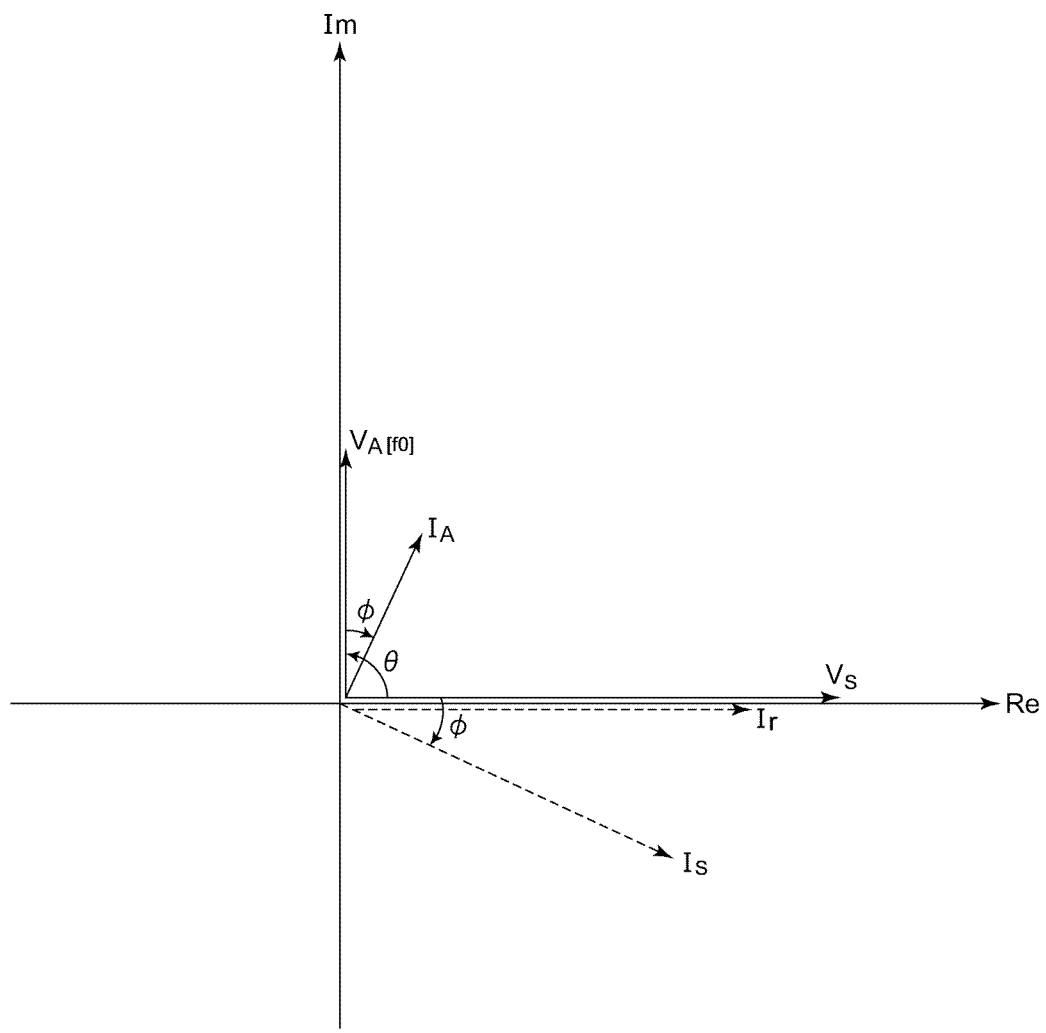
FIG. 6 is a phasor diagram (vector diagram) for describing the quasi-resonant state provided by the ATAC.

FIG. 6 is a phasor diagram (vector diagram) for describing the quasi-resonant state provided by the ATAC 10. Description will be made with the phase of the probe signal $V_S$ as a reference (0 degrees). As described above, the auxiliary voltage $V_A$ is configured to have an approximately rectangular waveform. It should be noted that the component that contributes to the quasi-resonant state is the fundamental wave $f_0$ component ($V_{A[f0]}$) of the auxiliary voltage $V_A$.

Based on the "principle of superposition", the signal generator 13 and the ATAC 10 can be considered separately. That is to say, the resonance current $I_r$ that flows through the resonance circuit 12 is represented by the sum of Is and $I_A$, where (1) Is represents the current component induced by the probe signal $V_S$ when the ATAC 10 is virtually grounded, and (2) $I_A$ represents the current component induced by the auxiliary voltage $V_{A[f0]}$ when the signal generator 13 is virtually grounded.

The probe signal $V_S$ is applied with a phase $\theta=0$ degrees, and the auxiliary voltage $V_{A[f0]}$ is applied with a phase $\theta=90$ degrees. When $fr<f_0$, the current Is flows with a phase that is delayed by $\phi$ with respect to the voltage $V_S$. In the same way, the current $I_A$ flows with a phase that is delayed by $\phi$ with respect to the voltage $V_{A[f0]}$.

There is a phase difference $\theta$ (=90 degrees) between the probe signal $V_S$ and the auxiliary voltage $V_{A[f0]}$. Thus, there is a phase difference of 90 degrees between the current components Is and $I_A$. By optimizing the amplitude of the auxiliary voltage $V_{A[f0]}$, i.e., the amplitude of the current component $I_A$, such an arrangement is capable of providing phase matching between the probe signal $V_S$ (having a phase of 0 degrees) and a resultant current obtained by combining the two current components Is and $I_A$. That is to say, such an arrangement provides a quasi-resonant state.

Directing attention again to the operation of the ATAC 10, regardless of the phase of the auxiliary voltage $V_A$, the current that flows through the first terminal P1 has only a component that flows in synchronization with the operations of the first switch SW1 and second switch SW2. Thus, after the transient state, the auxiliary capacitor $C_{A1}$ is charged to a voltage level such that the phase of the resonance current $I_r$ matches the phase of the probe voltage $V_S$. As a result, the auxiliary voltage $V_A$ is automatically generated so as to provide such a quasi-resonant state. Thus, the system including the ATAC 10, the resonance circuit 12, and the signal generator 13 is automatically tuned so as to provide such a quasi-resonant state.

[Operation of Impedance Measurement Apparatus 1]

Next, description will be made regarding the impedance detection operation of the impedance detection unit 16 for detecting the impedance of the detection target 2. As described above, the impedance detection unit 16 detects the impedance of the detection target 2 using the effect of the quasi-resonant state.

Based on the equivalent circuit diagram shown in FIG. 3, the following relation expression is obtained.

$$V_S - V_{A[f0]} = I_r \times Z \tag{1}$$

$$Z = (R + j\omega L + 1/j\omega C) \tag{2}$$

Here, Z represents the impedance of the resonance circuit 12, $\omega=2\pi \cdot f_0$, R represents the resistance value of the resistor $R_s$, L represents the inductance of the inductor $L_r$, and C represents the capacitance value of the capacitance $C_r$. Here, R, L, and $\omega$ are known values.

In the quasi-resonant state, the following Expressions (3) and (4) hold true.

$$V_S = R \times I_r \tag{3}$$

$$V_{A[f0]} = -(j\omega L + 1/j\omega C) \times I_r \tag{4}$$

By transforming the Expression (4), the following Expression (5) is obtained.

$$1/j\omega C = -V_{A[f0]}/I_r + j\omega L \tag{5}$$

As can be clearly understood from FIG. 6, the current $I_r$ has a phase delay of 90 degrees with respect to the phase of the voltage $V_{A[f0]}$. Thus, with the amplitude of $V_{A[f0]}$ as $|V_{A[f0]}|$, and with the amplitude of $I_r$ as $|I_r|$, $V_{A[f0]}$ is represented by $V_{A[f0]} = j \times |V_{A[f0]}|$, and $I_r$ is represented by $I_r = |I_r|$. Thus, the following Expression (6) can be obtained.

$$1/j\omega C = -j \times |V_{A[f0]}|/|I_r| + j\omega L \tag{6}$$

Thus, the capacitance C of the detection target 2 is represented by the following Expression (7).

$$C = 1/\{\omega \times |V_{A[f0]}|/|I_r| - \omega^2 L\} \tag{7}$$

Here, L and $\omega$ are known values. Thus, if the auxiliary voltage $V_{A[f0]}$ and the resonance current $I_r$ are known values, the impedance of the detection target 2, i.e., the capacitance value C, can be derived. The impedance detection unit 16 shown in FIG. 2 includes a current measurement unit 161, a voltage measurement unit 162, and a calculation unit 163. The current measurement unit 161 detects the resonance current $I_r$, and the voltage measurement unit 162 detects the auxiliary voltage $V_{A[f0]}$. The calculation unit 163 calculates the impedance C of the detection target 2 based on Expression (7) using the current $I_r$ and the voltage $V_{A[f0]}$ respectively detected by the current measurement unit 161 and the voltage measurement unit 162.

The current measurement unit 161 is configured to detect the resonance current $I_r$ using any one of the following methods.

(1) If the amplitude of the probe signal $V_S$ is a known value, and the resistance value R of the resistor $R_s$ is a known value, the current measurement unit 161 may calculate the resonance current $I_r$ based on Expression (3), for example.

(2) The current measurement unit 161 may include an ammeter connected in series with the measurement auxiliary circuit 11, and thus it may directly measure the resonance current $I_r$.

(3) The current measurement unit 161 may measure the voltage $V_{Lr}$ across both ends of the inductor $L_r$, and may derive the resonance current $I_r$ based on the expression $I_r = V_{Lr}/(\omega L)$.

As described above, in the present invention, the detection method employed in the current measurement unit 161 for detecting the resonance current $I_r$ is not restricted in particular.

The voltage measurement unit 162 may detect the auxiliary voltage $V_{A[f0]}$ using any one of the following methods.

(1) The voltage measurement unit 162 may include a voltmeter which measure the electric potential at the first terminal P1 of the ATAC 10, for example. The voltage measurement unit 162 thus configured may measure the amplitude of the auxiliary voltage $V_{A[f0]}$, i.e., $|V_{A[f0]}|$. It should be noted that the auxiliary voltage $V_A$ is configured as a voltage signal having a rectangular waveform. Thus, before the measurement of the amplitude $|V_{A[f0]}|$, such an arrangement requires predetermined processing such as peak hold processing of the auxiliary voltage $V_A$, filtering of the auxiliary voltage $V_A$, or the like.

(2) More preferably, the voltage measurement unit 162 may include a voltmeter which measures the capacitor voltage $V_{CA1}$ across an auxiliary capacitor $C_{A1}$ included within the ATAC 10. The current measurement unit 161 thus configured may acquire the amplitude $|V_{A[f0]}|$ of the auxiliary voltage $V_{A[f0]}$ based on the capacitor voltage $V_{CA1}$.

For example, with the ATAC 10 shown in FIG. 3, the amplitude $|V_A|$ of the auxiliary voltage $V_A$ having a rectangular waveform matches $V_{CA1}/2$. In the quasi-resonant state, the capacitor voltage $V_{CA1}$ exhibits a substantially constant level. Thus, by measuring the capacitor voltage $V_{CA1}$, such an arrangement is capable of acquiring the amplitude $|V_A|$ in a simple manner as compared with an arrangement configured to measure the auxiliary voltage $V_A$ itself.

Using Fourier series expansion of the rectangular wave, the following relation expression holds true between the amplitude $|V_A|$ of the auxiliary voltage $V_A$ having a rectangular waveform and the amplitude $|V_{A[f0]}|$ of the fundamental wave component $V_{A[f0]}$ of the auxiliary voltage $V_A$.

$$|V_{A[f0]}| = |V_A| \times 4\pi$$

Thus, the amplitude $|V_{A[f0]}|$ of the fundamental wave component $V_{A[f0]}$ can be derived based on the following Expression using the capacitor voltage $V_{CA1}$.

$$|V_{A[f0]}| = V_{CA1}/2 \times 4\pi$$

The above is the configuration and the operation principle of the impedance measurement apparatus 1.

As described above, with the impedance measurement apparatus 1 according to the embodiment, the ATAC 10 is capable of performing an automatic tuning operation. Furthermore, the ATAC 10 requires only a short period of time to provide a quasi-resonant state. Thus, such an arrangement does not require a complicated tuning operation or otherwise a lengthy tuning operation, unlike conventional resonance methods which require such a troublesome tuning operation. Thus, such an arrangement is capable of measuring the impedance of the detection target 2 with high precision in a short period of time using a low-cost measurement apparatus.

[Another Embodiment of a Capacitor-type ATAC]

Figure 7:
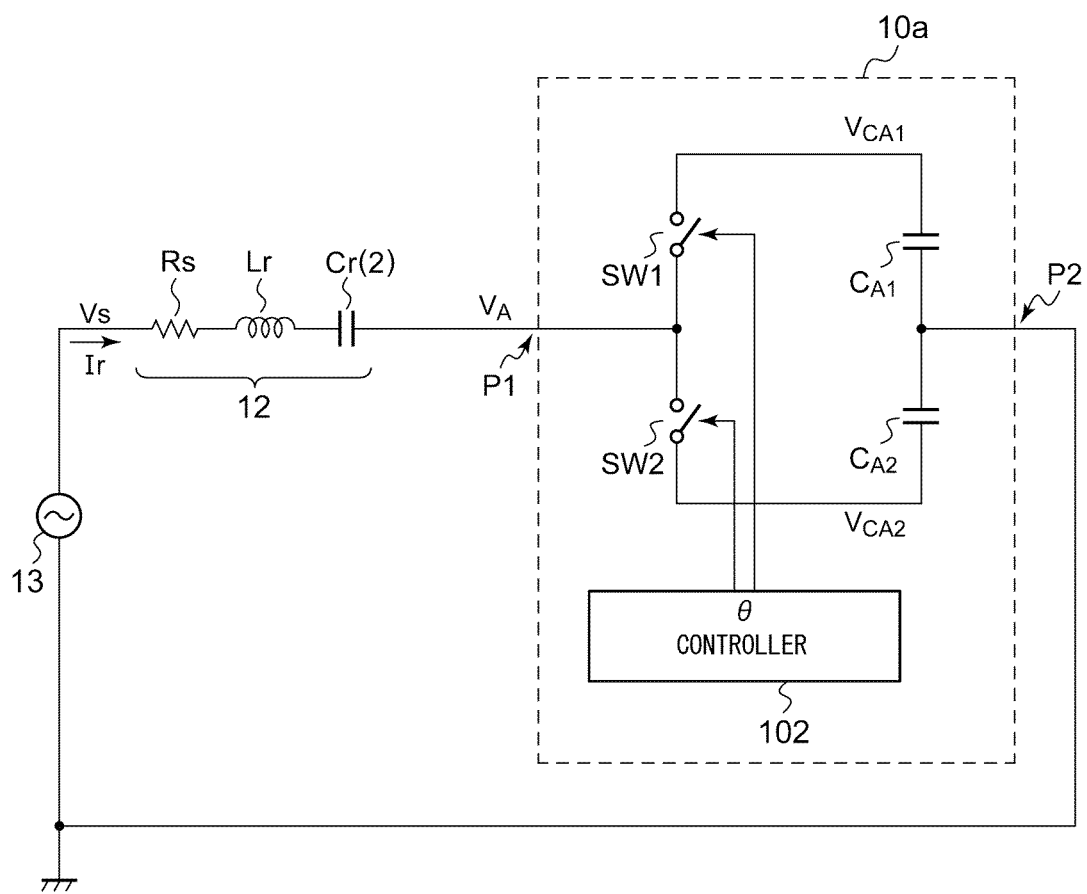
FIG. 7 is a circuit diagram showing an impedance measurement apparatus according to a second example.

Next, description will be made regarding the impedance measurement apparatus 1 according to a second example. FIG. 7 is a circuit diagram showing an impedance measurement apparatus 1a according to the second example. In FIG. 7, the impedance measurement unit 16 is not shown.

In the impedance measurement apparatus 1a, an ATAC 10a includes two auxiliary capacitors $C_{A1}$ and $C_{A2}$. More specifically, the ATAC 10a further includes the second auxiliary capacitor $C_{A2}$ in addition to the configuration shown in FIG. 3 including the first terminal P1, the second terminal P2, the first switch SW1, the second switch SW2, the first auxiliary capacitor $C_{A1}$, and the controller 102. The second auxiliary capacitor $C_{A2}$ is arranged in series with the second switch SW2 between the first terminal P1 and the second terminal P2. The second switch SW2 and the second auxiliary capacitor $C_{A2}$ may be mutually exchanged.

In the ATAC 10a shown in FIG. 7, in the on time $T_{ON1}$ of the first switch SW1, the auxiliary voltage $V_A$ becomes equal to the capacitor voltage $V_{CA1}$. In the on time $T_{ON2}$ of the second switch SW2, the auxiliary voltage $V_A$ becomes equal to the capacitor voltage $V_{cA2}$.

With the impedance measurement apparatus 1a including the ATAC 10a, the capacitor voltages $V_{CA1}$ and $V_{CA2}$ are automatically optimized. Thus, the system including the ATAC 10a, the resonance circuit 12, and the signal generator 13 is stabilized to a quasi-resonant state.

Figure 8:
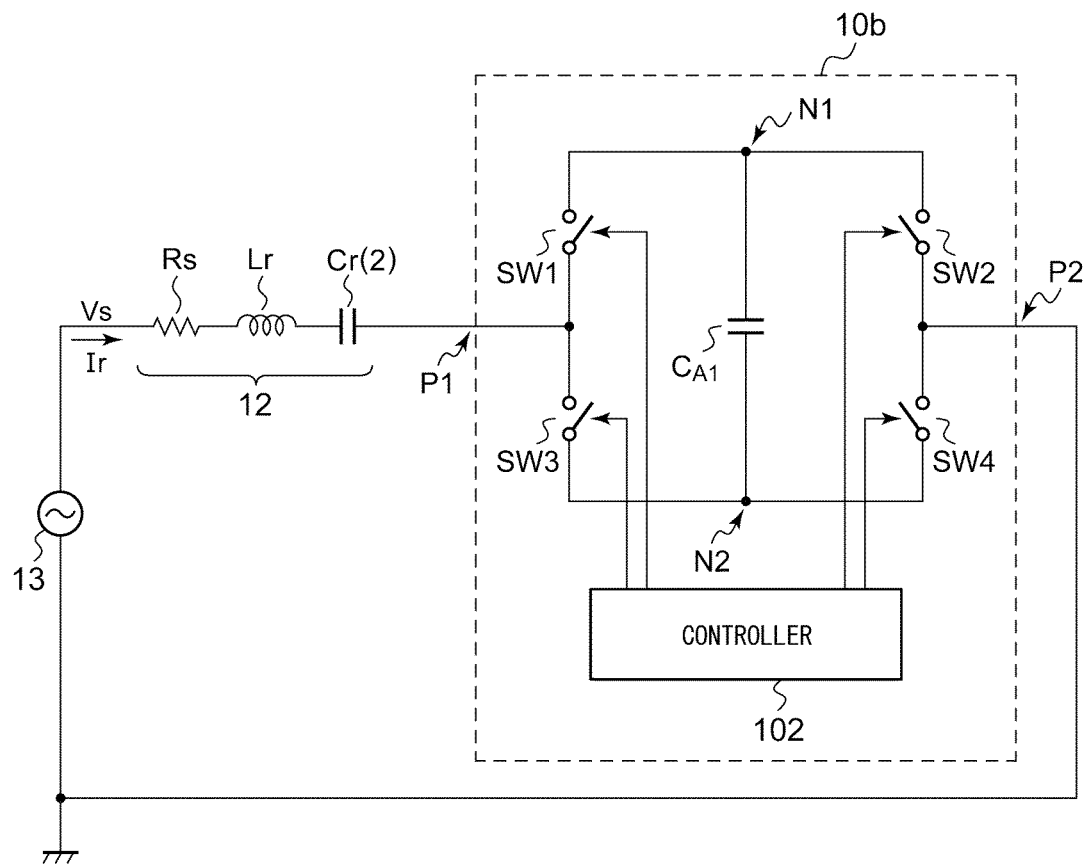
FIG. 8 is a circuit diagram showing an impedance measurement apparatus according to a third example.

Next, description will be made regarding an impedance measurement apparatus 1b according to a third example. FIG. 8 is a circuit diagram showing the impedance measurement apparatus 1b according to the third example. The impedance measurement apparatus 1b shown in FIG. 8 includes a single auxiliary capacitor as with the first example. However, there is a difference in the topology of the multiple switches between the third example and the first example.

The ATAC 10b includes a first terminal P1, a second terminal P2, a first switch SW1, a second switch SW2, a third switch SW3, a fourth switch SW4, a first auxiliary capacitor $C_{A1}$, and a controller 102b.

The first switch SW1 through the fourth switch SW4 form a so-called H-bridge (full-bridge) circuit. Specifically, the first switch SW1 and the second switch SW2 are arranged in series between the first terminal P1 and the second terminal P2. The third switch SW3 and the fourth switch SW4 are sequentially arranged in series between the first terminal P1 and the second terminal P2 such that they form a circuit arranged in parallel with a circuit comprising the first switch SW1 and the second switch SW2.

The first auxiliary capacitor $C_{A1}$ is arranged between a connection node N1 that connects the first switch SW1 and the second switch SW2 and a connection node N2 that connects the third switch SW3 and the fourth switch SW4. The first auxiliary capacitor $C_{A1}$ is preferably configured to have a capacitance value that is sufficiently greater than that of the resonance capacitor $C_{PX}$.

The first switch SW1 through the fourth switch SW4 may each be configured as a uni-directional switch. In this case, the controller 102b switches on and off the first switch SW1 through the fourth switch SW4 with a phase $\theta$ such that no current flows through their respective inversely conducting elements. That is to say, a restriction is placed on the phase $\theta$.

Alternatively, the first switch SW1 through the fourth switch SW4 may each be configured as a bi-directional switch. In this case, such an arrangement has an advantage of relaxing the constraints of the phase $\theta$ of the switching operation of the controller 102b.

The above is the configuration of the impedance measurement apparatus 1b according to the third example. Next, description will be made regarding the operation thereof.

Figure 9:
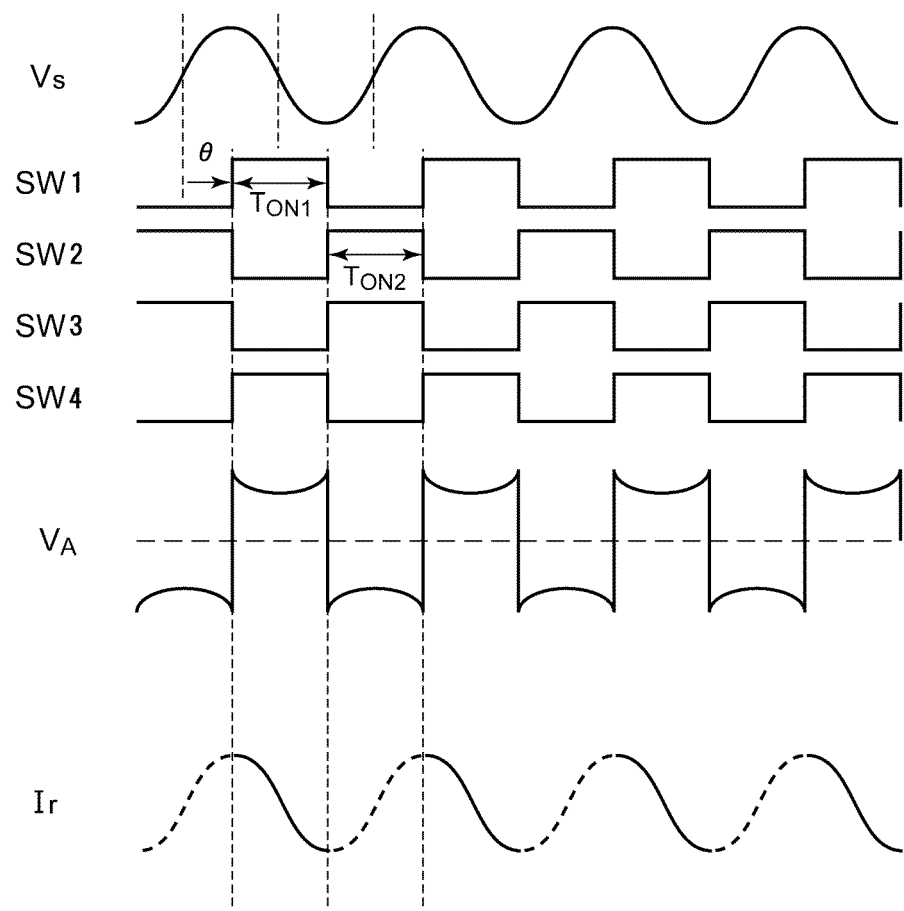
FIG. 9 is an operation waveform diagram showing the operation of the impedance measurement apparatus shown in FIG. 8.

FIG. 9 is an operation waveform diagram showing the operation of the impedance measurement apparatus 1b shown in FIG. 8. FIG. 9 shows, in the following order beginning from the top, the probe signal $V_S$, the voltages applied to the first switch SW1 through the fourth switch SW4, the auxiliary voltage $V_A$, and the resonance current $I_r$ that flows through the resonance circuit 12. In the waveforms which indicate the voltages applied to the switches, the high-level state represents the on state, and the low-level state represents the off state. It should be noted that FIG. 9 shows the waveforms of the resonance current $I_r$ obtained after a sufficient time has elapsed after the ATAC 10b starts to operate.

A first pair comprising the first switch SW1 and the fourth switch SW4 is switched on and off in a complementary manner with a given phase difference θ=90 degrees with respect to the probe voltage $V_S$. A second pair comprising the second switch SW2 and the third switch SW3 is switched on and off in a complementary manner with respect to the first pair. In the on time $T_{ON1}$ of the first pair, the resonance current $I_r$ flows through a path comprising the first switch SW1, the first auxiliary capacitor $C_{A1}$, and the fourth switch SW4. In the on time $T_{ON2}$ of the second pair, the resonance current $I_r$ flows through a path comprising the second switch SW2, the first auxiliary capacitor $C_{A1}$, and the third switch SW3.

The first auxiliary capacitor $C_{A1}$ is charged and discharged using the resonance current $I_r$. As a result, the capacitor voltage $V_{CA1}$ is generated at the first auxiliary capacitor $C_{A1}$. The ATAC 10b applies the auxiliary voltage $V_A$ to one terminal of the resonance circuit 12. In the on time $T_{ON1}$ of the first pair, the auxiliary voltage $V_A$ is set to a first polarity. In the on time $T_{ON2}$ of the second pair, the auxiliary voltage $V_A$ is set to a second polarity. The ATAC 10b can be regarded as a correction power supply which applies the auxiliary voltage $V_A$ to the resonance circuit 12. That is to say, the operation principle of the impedance measurement apparatus 1b is the same as that described in the first and second examples.

By applying the auxiliary voltage $V_A$ to the resonance circuit 12 according to the capacitor voltage $V_{CA1}$, such an arrangement is capable of locking the phase of the resonance current $I_r$ so as to provide a quasi-resonant state.

[Summary of Capacitor-type ATAC]

Description has been made in the first and second examples regarding an arrangement employing one or otherwise two auxiliary capacitors. Also, the number of auxiliary capacitors may be determined as desired so as to configure a circuit having the same effects, which can be readily understood by those skilled in this art.

Description has been made in the first and second examples regarding an arrangement employing two switches, and description has been made in the third example regarding an arrangement employing four switches. Also, the topology of the multiple switches may be modified according to the number of auxiliary capacitors, which can be readily conceived by those skilled in this art.

That is to say, by generalizing the invention according to the first embodiment realized by the first example through the third example, the following technical ideas can be derived.

[First Technical Idea]

An ATAC 10 includes a first terminal P1 and a second terminal P2 coupled with a resonance circuit 12, N (N represents an integer) auxiliary capacitors $C_{A1}$ through $C_{AN}$, multiple, i.e., M (M represents an integer) switches SW1 through SWM, and a controller 102. The multiple switches SW1 through SWM are each arranged between two from among the first terminal P1, the second terminal P2, and the terminals of the N auxiliary capacitors $C_{A1}$ through $C_{AN}$. The controller 102 switches on and off each of the multiple switches SW1 through SWM in synchronization with a probe signal $V_S$. More specifically, the controller 102 switches on and off each of the multiple switches SW1 through SWM with a predetermined phase difference with respect to the probe signal $V_S$.

From another viewpoint, the following technical idea can be derived.

[Second Technical Idea]

An ATAC 10 includes N (N represents an integer) auxiliary capacitors $C_{A1}$ through $C_{AN}$, multiple, i.e., M (M represents an integer) switches SW1 through SWM, and a controller 102. The multiple switches SW1 through SWM are arranged so as to allow each of the N auxiliary capacitors $C_{A1}$ through $C_{AN}$ to be charged and discharged using a current $I_r$ that flows through the resonance circuit 12. The controller 102 switches on and off the multiple switches SW1 through SWM so as to generate the capacitor voltages $V_{CA1}$ through $V_{CAN}$ at respective ends of each of the N auxiliary capacitors $C_{A1}$ through $C_{AN}$. Furthermore, the controller 102 applies, to the resonance circuit 12, the auxiliary voltage $V_A$ that corresponds to the capacitor voltages $V_{CA1}$ through $V_{CAN}$ respectively generated at the N auxiliary capacitors $C_{A1}$ through $C_{AN}$.

Thus, the present invention is not restricted to such configurations described in the first through third examples. Rather, various kinds of automatic tuning assist circuits configured in various kinds of manners derived based on the first and second technical ideas are encompassed within the technical scope of the present invention.

[Inductor-type ATAC]

Next, description will be made regarding an impedance measurement apparatus employing an inductor-type ATAC.

Figure 10:
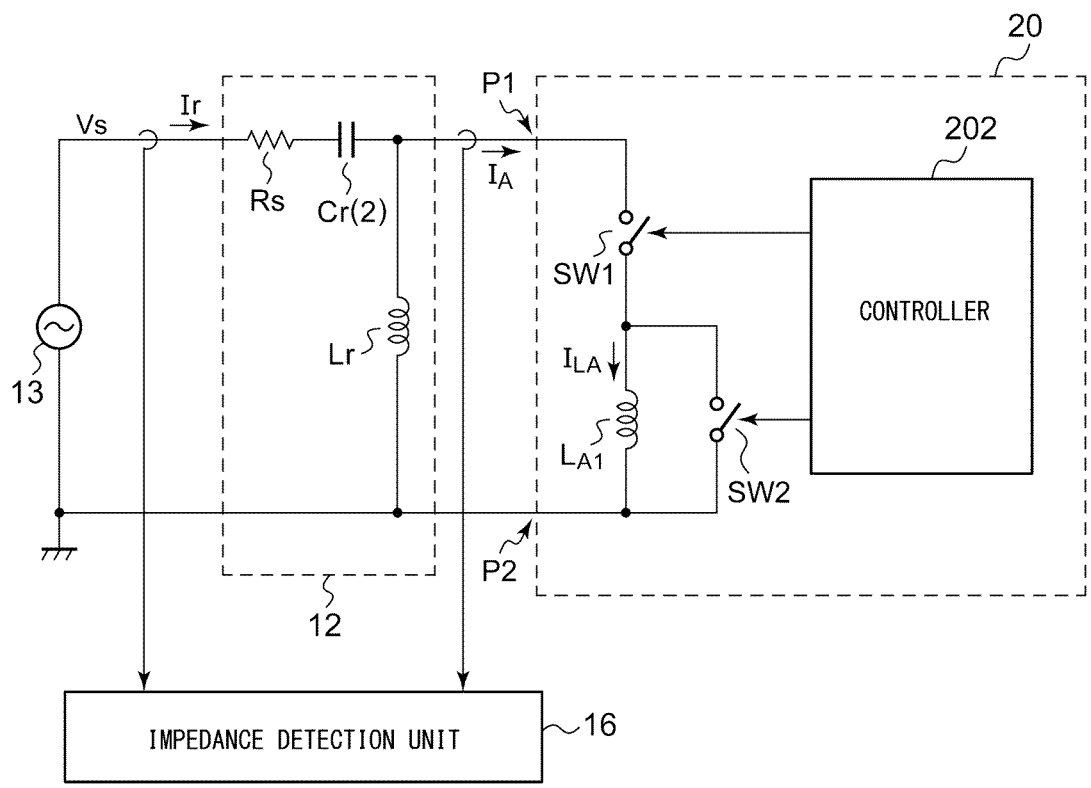
FIG. 10 is a circuit diagram showing an impedance measurement apparatus according to a fourth example.

FIG. 10 is a circuit diagram showing an impedance measurement apparatus 1d according to a fourth example. An ATAC 20 of the impedance measurement apparatus 1d is coupled with the resonance circuit 12. The ATAC 20 is configured to inject a first correction current $I_A$ (as a source) into the resonance circuit 12, and to draw the correction current $I_A$ (as a sink) from the resonance circuit 12. In FIG. 10, the ATAC 20 is connected in parallel with an inductor $L_r$ included in the resonance circuit 12. It should be noted that the ATAC 20 may be connected in parallel with the detection target 2. Description will be made in the present embodiment with the direction from the resonance circuit 12 to the automatic tuning assist circuit 30 (sink current direction) as the positive direction of the correction current $I_A$.

The ATAC 20 includes a first terminal P1, a second terminal P2, a first switch SW1, a second switch SW2, a first auxiliary coil $L_{A1}$, and a controller 202.

The first terminal P1 and the second terminal P2 are coupled with the resonance circuit 12. The first switch SW1 and the first auxiliary coil $L_{A1}$ are arranged in series between the first terminal P1 and the second terminal P2. The first switch SW1 and the first auxiliary coil $L_{A1}$ may mutually be exchanged. The second switch SW2 is arranged in parallel with the first auxiliary coil $L_{A1}$.

The controller 202 switches on and off each of the multiple switches SW1 and SW2 in synchronization with the probe signal $V_S$, and more specifically, with a predetermined phase difference θ with respect to the probe signal V. The phase difference θ is preferably set to a value in the vicinity of 0 degrees, i.e., in the vicinity of the phase matching state. Also, the phase difference θ may be set to a value that differs from 0 degrees. For ease of understanding and simplification of description, description will be made regarding an arrangement in which θ=0 degrees.

The ATAC 20 alternately and repeatedly switches the state between a first state φ1 and a second state φ2 with the same frequency as that of the probe signal $V_S$. That is to say, in the present embodiment, the switching frequency is the same as the frequency $f_0$ of the probe signal $V_S$.

In the first state φ1, the first switch SW1 is turned on, and the second switch SW2 is turned off. In this state, the first auxiliary coil $L_{A1}$ is coupled with the resonance circuit 12. Thus, the correction current $I_A$ that corresponds to the current $I_{LA1}$ that flows through the first auxiliary coil $L_{A1}$ is injected into the resonance circuit 12, or otherwise is drawn from the resonance circuit 12. In the second state φ2, the second switch SW2 is turned on, and the first switch SW1 is turned off. In this state, the first auxiliary coil $L_{A1}$ is disconnected from the resonance circuit 12. Thus, the current $I_{LA1}$ that flows through the first auxiliary coil $L_{A1}$ flows through a current path (SW2) that is independent of the resonance circuit 12.

The controller 202 switches the state between the first state φ1 and the second state φ2 with the same frequency $f_0$ as that of the probe signal $V_S$ and with a predetermined phase difference θ with respect to the probe signal $V_S$.

As with the first embodiment, each switch may be configured as a uni-directional switch or otherwise a bi-directional switch. It should be noted that, in a case in which each switch is configured as a uni-directional switch, the controller 202 switches on and off each switch with a phase such that no current flows through their respective inversely conducting elements.

The above is the configuration of the impedance measurement apparatus 1d. Next, description will be made regarding the operation thereof.

Description will be made regarding an arrangement in which the switches SW1 and SW2 are each configured as a bi-directional switch configured to prevent a current from flowing in both directions in the off state.

Figure 11:
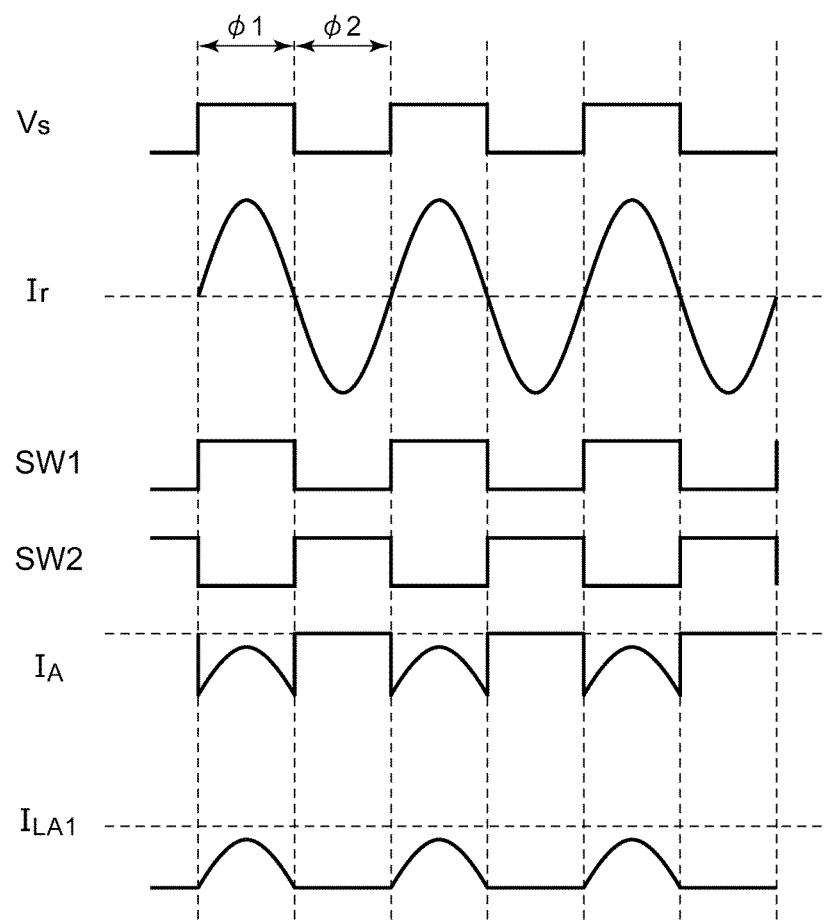
FIG. 11 is an operation waveform diagram showing the operation of the impedance measurement apparatus shown in FIG. 10.

FIG. 11 is an operation waveform diagram showing the operation of the impedance measurement apparatus 1d shown in FIG. 10. FIG. 11 shows, in the following order beginning from the top, the probe signal $V_S$, the resonance current $I_r$, the voltages applied to the first switch SW1 and the second switch SW2, the correction current $I_A$, and the current $I_{LA1}$ that flows through the first auxiliary coil $L_{A1}$. In the drawing, the resonance current $I_r$ is shown having a waveform in a steady state after a sufficient period of time has elapsed after the ATAC 20 starts to operate.

By repeatedly switching the state between the first state φ1 and the second state φ2, such an arrangement is capable of automatically adjusting the magnitude and the direction of the current $I_{LA1}$ that flows through the first auxiliary coil $L_{A1}$ such that the phase of the resonance current $I_r$ matches the phase of the probe signal $V_S$.

In the second state φ2, the current $I_{LA1}$ flows through a loop including the second switch SW2, and is maintained at a constant level. In the first state φ1, the current $I_{LA1}$ is supplied to the resonance circuit 12 as a correction current $I_A$. That is to say, the ATAC 20 can be regarded as a correction current source configured to supply the correction current $I_A$ to the resonance circuit 12.

As described in the first embodiment, the ATAC 10 employing a capacitor can be regarded as an auxiliary voltage source. In contrast, the ATAC 20 employing a coil can be regarded as a correction current source which supplies the correction current $I_A$ to the resonance circuit 12.

The above is the operation of the impedance measurement apparatus 1d.

With the impedance measurement apparatus 1d shown in FIG. 10, such an arrangement allows the ATAC 20 to perform an automatic tuning operation which requires only a short period of time to provide a quasi-resonant state, as with the first embodiment. Thus, such an arrangement does not require a complicated tuning operation or otherwise a lengthy tuning operation, unlike conventional resonance methods which require such a troublesome tuning operation. Thus, such an arrangement is capable of measuring the impedance of the detection target 2 with high precision in a short period of time using a low-cost measurement apparatus.

With such an arrangement, the auxiliary current $I_A$ and the resonance current $I_r$ are detected by means of the impedance detection unit 16. Thus, such an arrangement is capable of acquiring the impedance (capacitance value) of the detection target 2 using the values of the auxiliary current $I_A$ and the resonance current $I_r$ thus detected.

[Modifications or Other Examples of an Inductor-type ATAC]

Figure 12A:
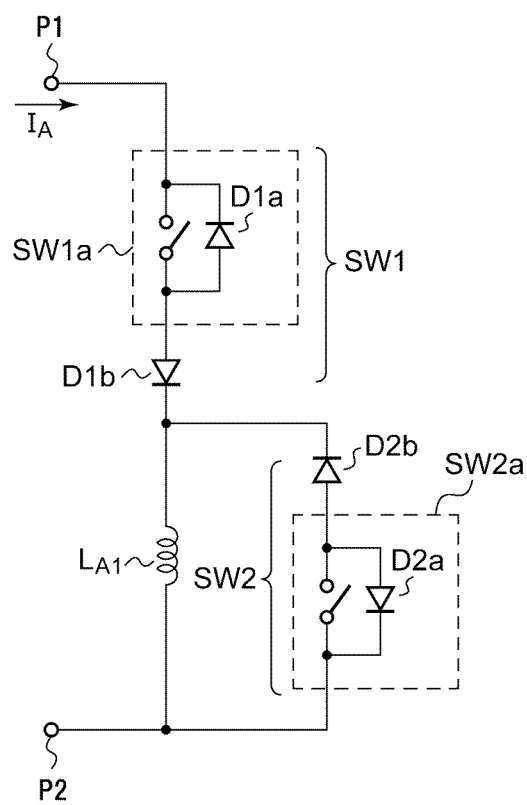
FIGS. 12A and 12B are circuit diagrams each showing a modification of the ATAC shown in FIG. 10.
Figure 12B:
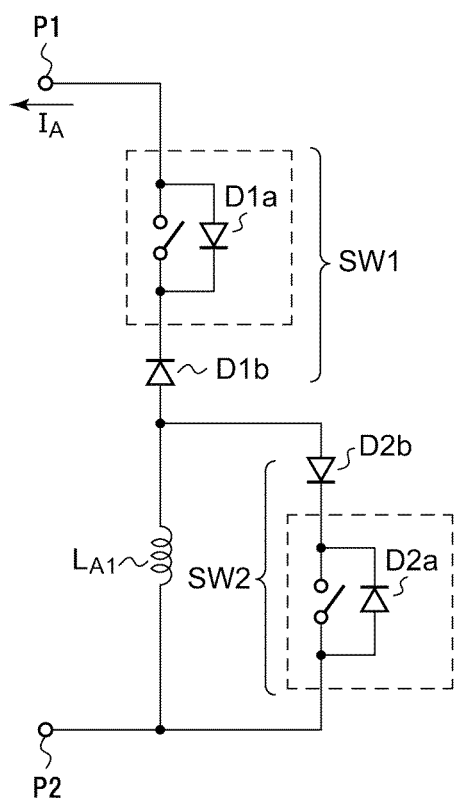

FIGS. 12A and 12B are circuit diagrams each showing a modification of the ATAC 20 shown in FIG. 10. With such modifications, the first switch SW1 and the second switch SW2 are each configured as a uni-directional switch.

In FIGS. 12A and 12B, the first switch SW1 includes a uni-directional switch SW1a and a rectifier diode D1b arranged in series with the uni-directional switch SW1a. The rectifier diode D1b is arranged in a direction that is the reverse of the direction of a parasitic diode (body diode) D1a which is an inversely conducting element of the uni-directional switch SW1a. The switch SW1a and the rectifier diode D1b may be mutually exchanged.

The second switch SW2 is configured in the same manner as the first switch SW1. That is to say, the second switch SW2 includes a uni-directional switch SW2a and a rectifier diode D2b arranged in series with the uni-directional switch SW2a. The rectifier diode D2b is arranged in a direction that is the reverse of the direction of a parasitic diode (body diode) D2a which is an inversely conducting element of the uni-directional switch SW2a. The switch SW2a and the rectifier diode D2b may be mutually exchanged.

By arranging the rectifier diode D1b (D2b) in a direction that is the reverse of that of the parasitic diode D1a (D2a), such an arrangement is capable of preventing the first switch SW1 and the second switch SW2 turning on at an unintended timing.

It should be noted that, in a case in which the first switch SW1 and the second switch SW2 are each configured as a bi-directional switch, the ATAC 20 allows the correction voltage $I_A$ to have both a positive value and a negative value. In contrast, the ATAC 20a shown in FIG. 12A is capable of generating the correction current $I_A$ having a positive value. However, the ATAC 20a cannot generate the correction current $I_A$ having a negative value. Conversely, the ATAC 20b shown in FIG. 12B is capable of generating the correction current $I_A$ having a negative value. However, the ATAC 20b cannot generate the correction current $I_A$ having a positive value. That is to say, with the automatic tuning assist circuits 20a or otherwise 20b shown in FIGS. 12A and 12B, the switching phases of the first switch SW1 and the second switch SW2 are restricted.

Figure 13:
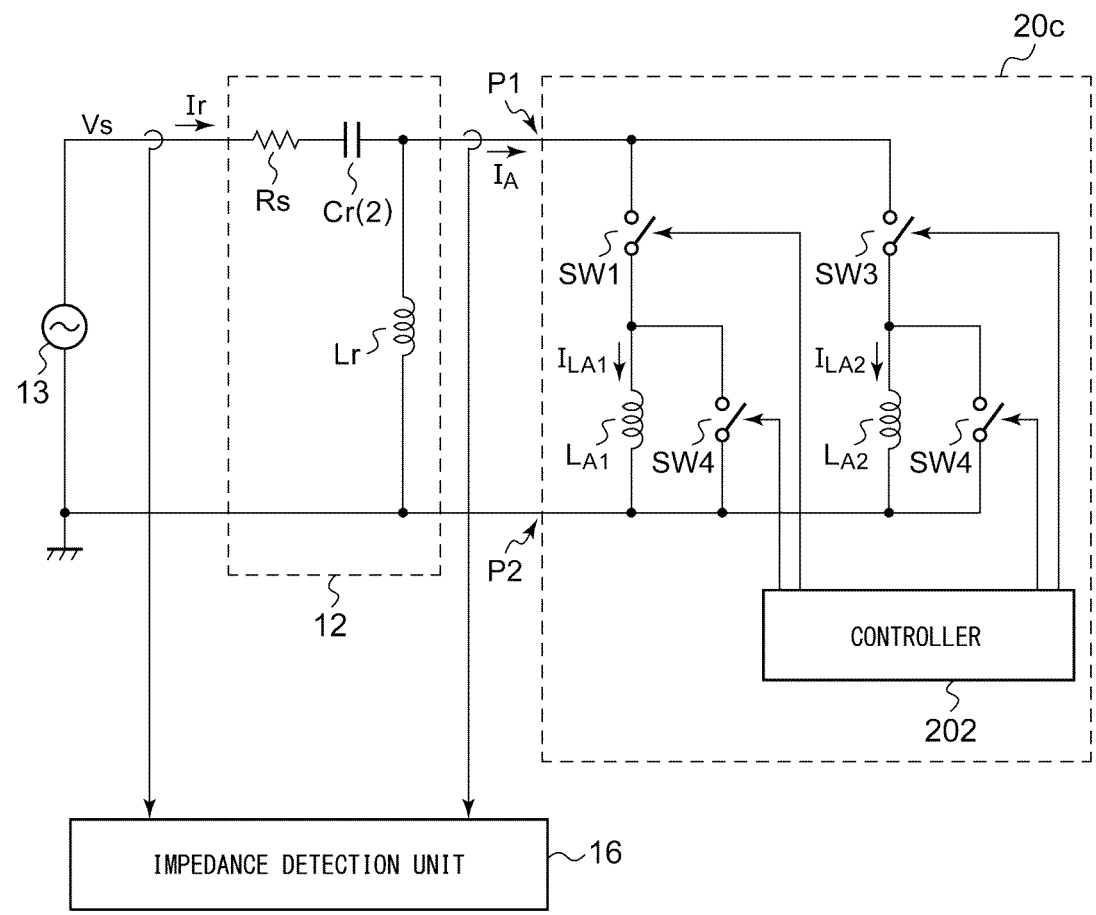
FIG. 13 is a circuit diagram showing an impedance measurement apparatus according to a fifth example.

FIG. 13 is a circuit diagram showing an impedance measurement apparatus 1e according to a fifth example.

The ATAC 20c further includes a third switch SW3, a fourth switch SW4, and a second auxiliary coil $L_{A2}$, in addition to the configuration of the ATAC 20 shown in FIG. 10. The third switch SW3 and the second auxiliary coil $L_{A2}$ are arranged in series between the first terminal P1 and the second terminal P2. The third switch SW3 and the second auxiliary coil $L_{A2}$ may be mutually exchanged. The fourth switch SW4 is arranged in parallel with the second auxiliary coil $L_{A2}$. In the first state φ1, the controller 202 turns on the first switch SW1 and the fourth switch SW4. In the second state φ2, the controller 202 turns on the second switch SW2 and the third switch SW3.

The above is the configuration of the impedance measurement apparatus 1e. Next, description will be made regarding the operation thereof.

Figure 14:
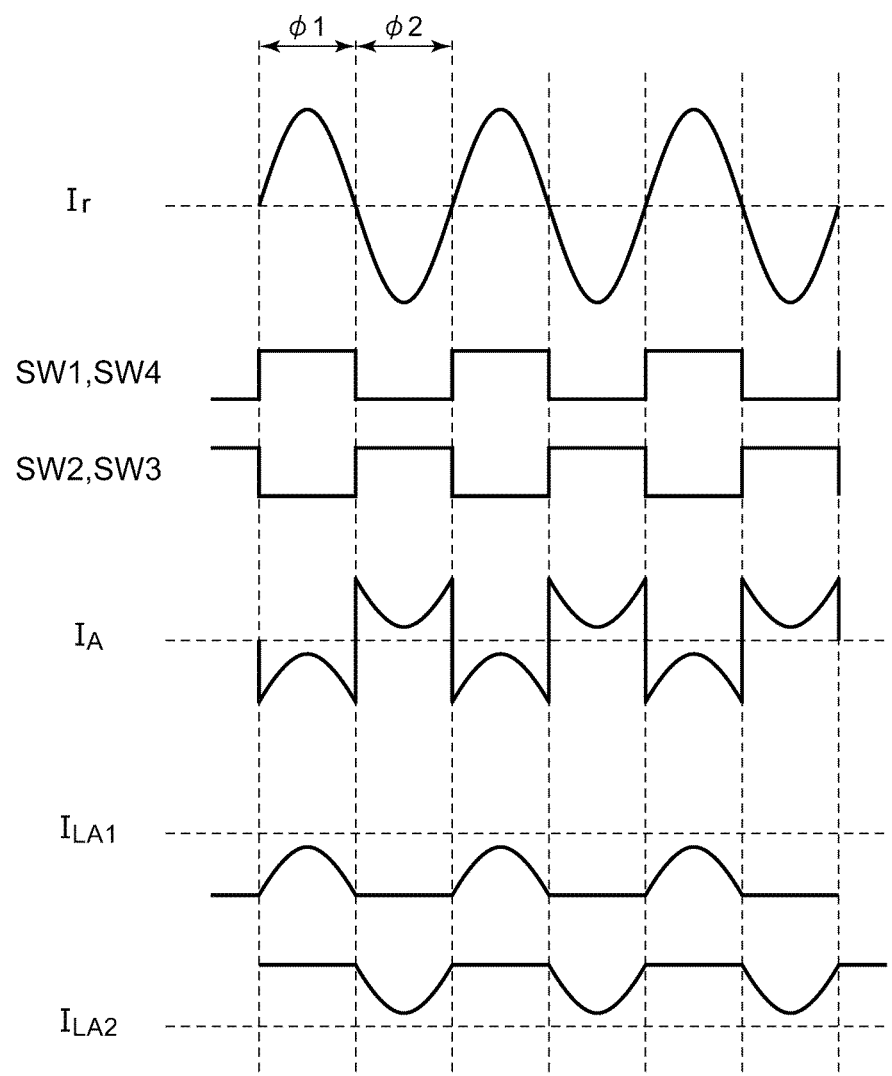
FIG. 14 is an operation waveform diagram showing the operation of the impedance measurement apparatus shown in FIG. 13.

FIG. 14 is an operation waveform diagram showing the operation of the impedance measurement apparatus 1e shown in FIG. 13.

In the first state φ1, the first auxiliary coil $L_{A1}$ is coupled with the resonance circuit 12, and the first correction current $I_A$ that corresponds to the current $I_{LA1}$ that flows through the first auxiliary coil $L_{A1}$ is injected into or otherwise is drawn from the resonance circuit 12. At that time, the second auxiliary coil $L_{A2}$ is disconnected from the resonance circuit 12, and the current $I_{LA2}$ that flows through the second auxiliary coil $L_{A2}$ flows through a current path that is independent of the resonance circuit 12.

In the second state φ2, the first auxiliary coil $L_{A1}$ is disconnected from the resonance circuit 12. In this state, the current $I_{LA1}$ that flows through the first auxiliary coil $L_{A1}$ flows through a current path that is independent of the resonance circuit 12. At that time, the second auxiliary coil $L_{A2}$ is coupled with the resonance circuit 12, and the second correction current $I_{A2}$ that corresponds to the current $I_{LA2}$ that flows through the second auxiliary coil $L_{A2}$ is injected into or otherwise is drawn from the resonance circuit 12.

That is to say, the two auxiliary coils $L_{A1}$ and $L_{A2}$ are coupled with the resonance circuit 12 in a complementary manner. Thus, the correction current $I_{A1}$ and the correction current $I_{A2}$ are alternately supplied to the resonance circuit 12. From another viewpoint, the ATAC 20a shown in FIG. 13 can be regarded as an arrangement comprising two ATACs 20 shown in FIG. 10, which are configured to operate with reverse phases. With such an arrangement, the correction current $I_{A1}$ supplied by the first auxiliary coil $L_{A1}$ and the correction current $I_{A2}$ supplied by the second auxiliary coil $L_{A2}$ have opposite polarities. The correction current $I_A$ supplied to the resonance circuit 12 is configured as the sum of the two correction currents $I_{A1}$ and $I_{A2}$.

The impedance measurement apparatus 1e thus configured provides the same advantages as those provided by the fourth example.

In the ATAC 20c shown in FIG. 13, the first switch SW1 through the fourth switch SW4 may each be configured using a uni-directional switch. In this case, the first switch SW1 and the second switch SW2 are each configured in the same manner as shown in FIG. 12A, and the third switch SW3 and the fourth switch SW4 are each configured in the same manner as shown in FIG. 12B. Such a modification provides the same advantages provided by the ATAC 20c shown in FIG. 13.

Figure 15:
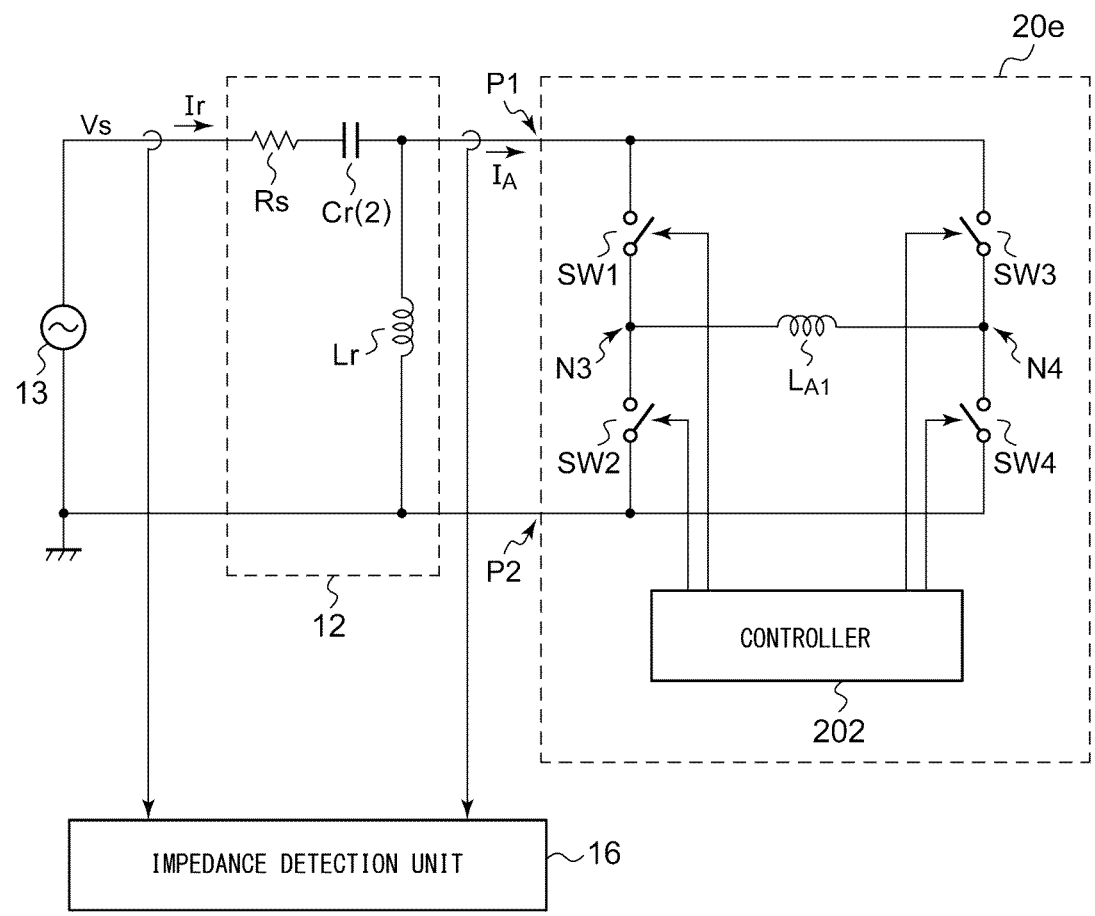
FIG. 15 is a circuit diagram showing an impedance measurement apparatus according to a sixth example.

FIG. 15 is a circuit diagram showing an impedance measurement apparatus 1f according to a sixth example.

An ATAC 20e includes a first switch SW1 through a fourth switch SW4 and a first auxiliary coil $L_{A1}$ that form an H-bridge circuit. Specifically, the first switch SW1 and the second switch SW2 are arranged in series between the first terminal P1 and the second terminal P2. The third switch SW3 and the fourth switch SW4 are arranged in series between the first terminal P1 and the second terminal P2 such that they form a circuit arranged in parallel with a circuit comprising the first switch SW1 and the second switch SW2. The first auxiliary coil $L_{A1}$ is arranged between a connection node N3 that connects the first switch SW1 and the second switch SW2 and a connection node N4 that connects the third switch SW3 and the fourth switch SW4.

The first switch SW1 through the fourth switch SW4 may each be configured as a uni-directional switch, or may each be configured as a bi-directional switch. In a case in which each switch is configured using a bi-directional switch, the switches SW1 through SW4 may be configured in the same manner as the switches SW1 through SW4 shown in FIG. 12.

The controller 202 switches states between a first state φ1 in which a pair comprising the first switch SW1 and the fourth switch SW4 is turned on and a second state φ2 in which a pair comprising the second switch SW2 and the third switch SW3 is turned on, with the same frequency as that of the probe signal V.

With the ATAC 20e shown in FIG. 15, such an arrangement requires only a single auxiliary coil to generate the correction current with both a positive polarity and a negative polarity.

[Summary of Inductor-type ATAC]

Description has been made in the fourth and fifth examples regarding an arrangement employing one or otherwise two auxiliary coils. Also, such an ATAC circuit having the same functions can be configured using a desired number of auxiliary coils, which can be readily understood by those skilled in this art.

Description has been made in the fourth example regarding an arrangement employing two switches, and description has been made in the fifth and sixth examples regarding an arrangement employing four switches. Also, the multiple switch topology may be modified as appropriate according to the number of auxiliary coils, which can be clearly understood by those skilled in this art.

That is to say, by generalizing the second embodiment realized by the fourth example through the sixth example, the following technical idea can be derived.

[Third technical idea]

An ATAC 20 includes a first terminal P1 and a second terminal P2 coupled with a resonance circuit 12, N (N represents an integer) auxiliary coils $L_{A1}$ through $L_{AN}$, multiple, i.e., M (M represents an integer) switches SW1 through SWM, and a controller 202. The multiple switches SW1 through SWM are arranged between two from among the first terminal P1, the second terminal P2, and the terminals of the N auxiliary coils $L_{A1}$ through $L_{AN}$. The controller 202 switches on and off each of the multiple switches SW1 through SWM in synchronization with the probe signal $V_S$.

From another viewpoint, the following technical idea can be derived.

[Fourth Technical Idea]

The ATAC 20 includes the auxiliary coil $L_A$. The ATAC 20 is configured to alternately and repeatedly switch the state between (1) the first state φ1 in which the auxiliary coil $L_A$ is coupled with the resonance circuit 12, and the correction current $I_A$ that corresponds to the current $I_{LA}$ that flows through the auxiliary coil $L_A$ is injected into the resonance circuit 12 or otherwise is drawn from the resonance circuit 12, and (2) the second state φ2 in which the auxiliary coil $L_A$ is disconnected from the resonance circuit 12, and the current $I_{LA}$ that flows through the auxiliary coil $L_A$ flows through a current path that is independent of the resonance circuit 12.

Thus, the present invention is not restricted to such configurations described in the fourth through sixth examples. Rather, various kinds of automatic tuning assist circuits configured in various kinds of manners derived based on the third or fourth technical idea are encompassed within the technical scope of the present invention.

Description has been made regarding the present invention with reference to the embodiments. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention.

[Topology of Measurement Auxiliary Circuit 11]

Various kinds of modifications may be made for the configuration of the measurement auxiliary circuit 11. Description will be made below regarding several modifications.

Figure 16A:
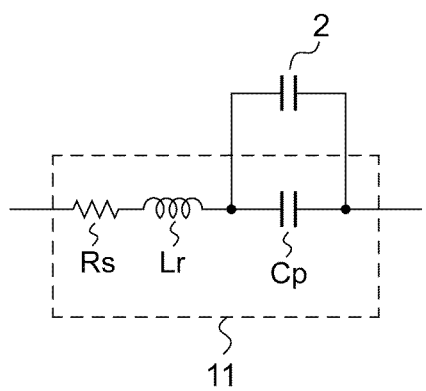
FIGS. 16A and 16B are circuit diagrams each showing a modification of a measurement auxiliary circuit.
Figure 16B:
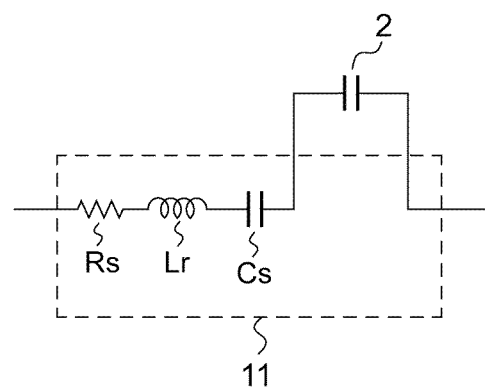

FIGS. 16A and 16B are circuit diagrams each showing a modification of the measurement auxiliary circuit 11. In FIG. 16A, the measurement auxiliary circuit 11 includes a capacitor $C_p$ arranged in parallel with the detection target 2. With such a modification, the impedance detection unit 16 measures the combined capacitance value $C_r$ represented by the expression $C_r = C + C_p$, where C represents the capacitance of the detection target 2 and $C_p$ represents the capacitance of the capacitor $C_p$. Thus, such a modification is capable of calculating the capacitance value C of the detection target 2 from the relation $C = C_r - C_p$.

In FIG. 16B, the measurement auxiliary circuit 11 includes a capacitor $C_s$ arranged in series with the detection target 2. With such a modification, the impedance detection unit 16 measures the combined capacitance value $C_r$ represented by the expression $C_r = 1/\{C^{-1} + C_s^{-1}\}$, where C represents the capacitance of the detection target 2 and $C_p$ represents the capacitance of the capacitor $C_p$. Thus, such a modification is capable of calculating the capacitance value C of the detection target 2 from the relation $C = 1/\{C_r^{-1} + C_s^{-1}\}$.

With the measurement auxiliary circuit 11 configured as shown in FIG. 2, if the capacitance value C of the detection target 2 is very large or otherwise is very small, this can excessively raise or lower the measurement sensitivity, leading to a risk of poor precision in the measurement of the capacitance value C. In order to solve such a problem, as shown in FIGS. 16A and 16B, an optimum topology may be selected for the measurement auxiliary circuit 11, and an optimum capacitance value may be selected for the capacitor $C_p$ or otherwise $C_s$, based on the capacitance value C of the detection target 2. Thus, such a modification is capable of measuring the capacitance value C with high precision. Also, the capacitor $C_p$ or $C_s$ may be configured as a variable capacitor, and the capacitance value of the capacitor $C_p$ or $C_s$ may be controlled based on the measurement range of the capacitance value C of the detection target 2.

Figure 17A:
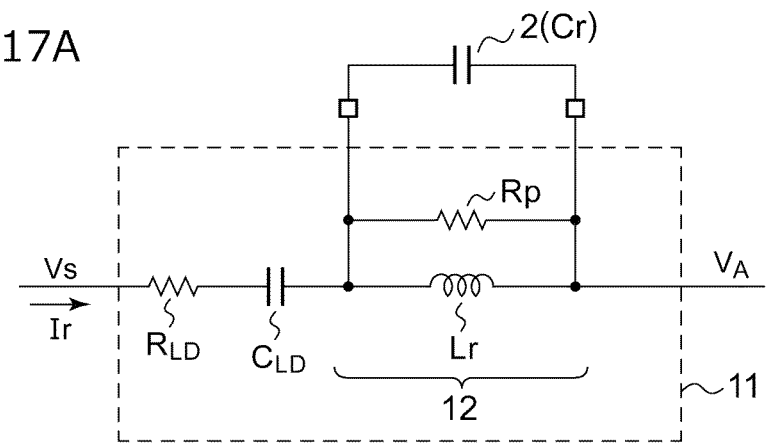
FIGS. 17A through 17C are circuit diagrams each showing a modification of a measurement auxiliary circuit.
Figure 17B:
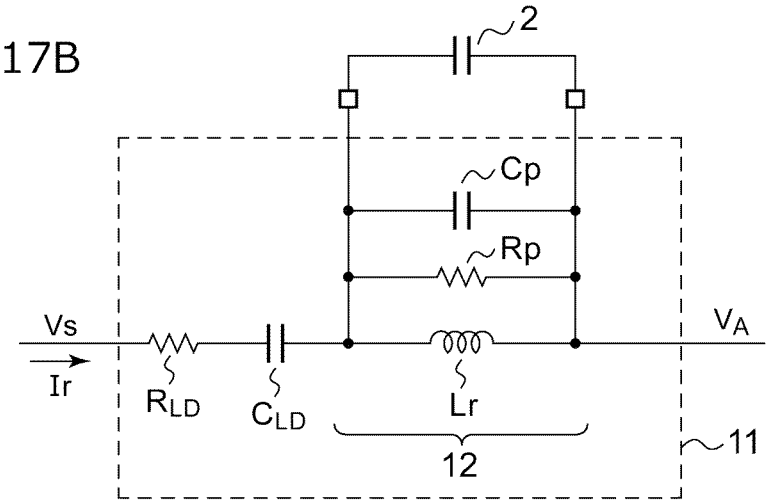
Figure 17C:
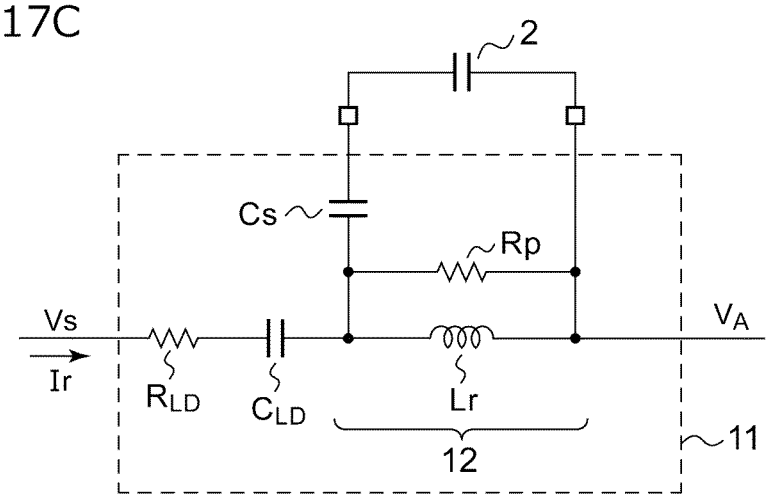

Description has been made in the embodiment regarding an arrangement in which the measurement auxiliary circuit 11 together with the detection target 2 form an RLC series resonance circuit. However, the present invention is not restricted to such an arrangement. Also, the measurement auxiliary circuit 11 together with the detection target 2 may form a parallel resonance circuit. FIGS. 17A through 17C are circuit diagrams each showing a modification of the measurement auxiliary circuit 11.

The measurement auxiliary circuit 11 shown in FIG. 17A includes a resistor $R_{LD}$, a capacitor $C_{LD}$, a resistor $R_p$, and an inductor $L_r$. The detection target 2, the resistor $R_p$, and the inductor $L_r$ form a parallel resonance circuit. The resistor $R_{LD}$ and the capacitor $C_{LD}$ may preferably be arranged in series with the parallel resonance circuit thus formed. The capacitor $C_{LD}$ is arranged in order to block the DC component. The resistor $R_{LD}$ is arranged in order to limit the magnitude of the current.

The following Expressions (9) and (10) hold true for the measurement auxiliary circuit 11 shown in FIG. 17A. Here, for ease of understanding and simplification of description, the capacitor $C_{LD}$ and the resistor $R_{LD}$ are ignored.

$$V_S - V_{A[f0]} = I_r \times Z \tag{9}$$

$$Z = 1/\{1/R + 1/j\omega L + j\omega C\} \tag{10}$$

Here, Z represents the impedance of the resonance circuit 12. Furthermore, $\omega = 2\pi \cdot f_0$. Moreover, R represents the resistance value of the resistor $R_p$, L represents the inductance of the inductor $L_r$, and C represents the capacitance value of the capacitance $C_r$. It should be noted that R, L, and $\omega$ are known values.

After a quasi-resonant state is obtained as a result of the automatic tuning operation of the ATAC 20, such an arrangement is capable of acquiring the value of C by calculation.

The measurement auxiliary circuit 11 shown in FIG. 17B includes a capacitor $C_p$ arranged in parallel with the detection target 2. The measurement auxiliary circuit 11 shown in FIG. 17C includes a capacitor $C_s$ arranged in series with the detection target 2. By selecting a suitable topology for the measurement auxiliary circuit 11 and by selecting suitable capacitance values for the capacitors $C_p$ or $C_s$, such an arrangement is capable of measuring the capacitance value C of the detection target 2 with high precision.

[Modification of Detection Target 2]

Figure 18A:
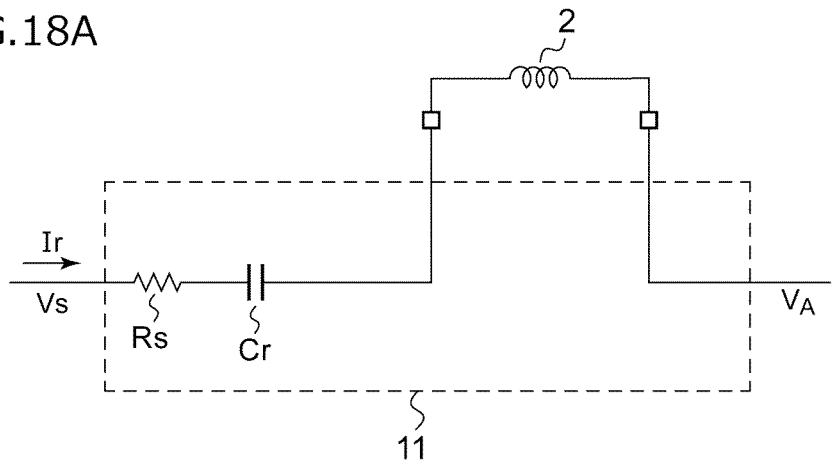
FIGS. 18A through 18C are circuit diagrams each showing a measurement auxiliary circuit used in the measurement of the inductance.
Figure 18B:
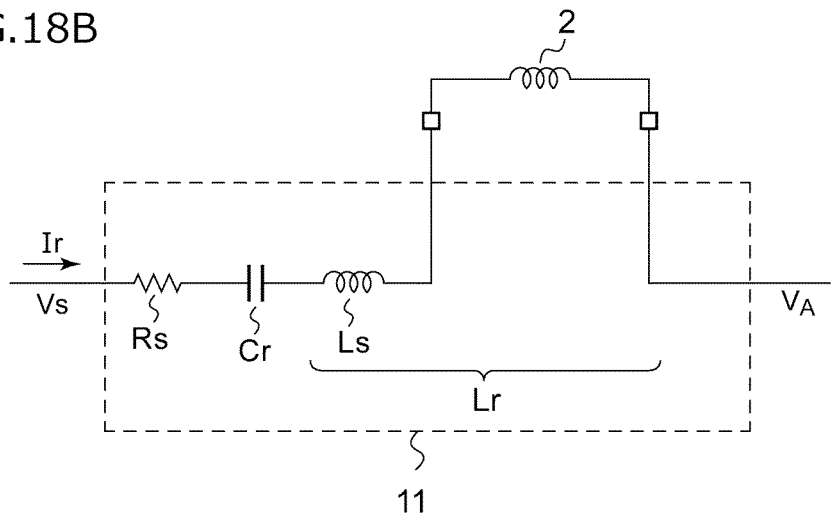
Figure 18C:
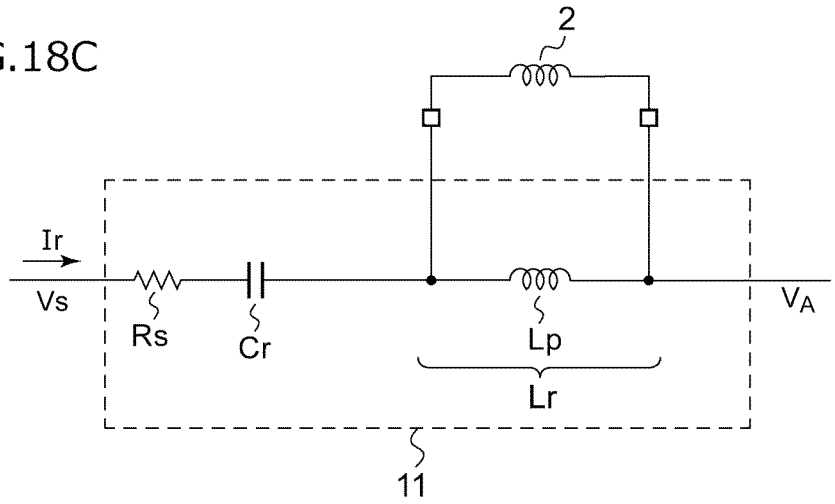

Description has been made in the embodiment regarding an arrangement configured to measure the capacitance of the detection target 2. Also, the present invention may be applied to the measurement of the inductance of the detection target 2. FIGS. 18A through 18C are circuit diagrams each showing the measurement auxiliary circuit 11 in a case in which the inductance is to be measured. The measurement auxiliary circuit 11 shown in FIG. 18A includes a resistor $R_s$ and a capacitor $C_r$ connected in series with the detection target 2, so as to form an RLC series resonance circuit together with the detection target 2.

After a stabilized quasi-resonant state is established by means of the ATAC, Expression (6) holds true. In the configuration shown in FIG. 18A, the capacitance value C of the capacitor $C_r$ is a known value, and the inductance L is an unknown value. The inductance value L can be obtained based on the following Expression (8).

$$L = 1/(\omega^2 \cdot C) + |V_{A[f0]}|/|I_r|/\omega \tag{8}$$

Thus, by measuring $|V_{A[f0]}|$ and $|I_r|$, the inductance value L can be calculated.

The measurement method for the resonance current $|I_r|$ is not restricted in particular. The current measurement unit 161 may detect the resonance current $I_r$ using any one of the following methods described below.

(1) In a case in which the amplitude of the probe signal $V_S$ is known, and the resistance value R of the resistor $R_s$ is known, the current measurement unit 161 may acquire the resonance current $I_r$ by calculation using Expression (3).

(2) The current measurement unit 161 may include an ammeter arranged in series with the measurement auxiliary circuit 11, and may directly measure the resonance current $I_r$.

(3) The current measurement unit 161 may measure the voltage $V_{Cr}$ across both ends of the capacitor $C_r$, and may detect the resonance current $I_r$ based on the relation $I_r = V_{Cr} \times \omega \times C$.

The measurement auxiliary circuit 11 shown in FIG. 18B includes an inductor $L_S$ arranged in series with the detection target 2. The impedance detection unit 16 measures the combined inductance $L_r$ represented by the expression $L_r = L + L_S$, where L represents the inductance of the detection target 2 and $L_S$ represents the inductance of the inductor $L_S$. Thus, such an arrangement is capable of calculating the inductance L of the detection target 2 from the relation $L = L_r - L_S$.

The measurement auxiliary circuit 11 shown in FIG. 18C includes an inductor $L_p$ arranged in parallel with the detection target 2. The impedance detection unit 16 measures the combined inductance $L_r$ represented by the expression $L_r = 1/$ $\{L^{-1}+L_p^{-1}\}$, where L represents the inductance of the detection target 2 and $L_p$ represents the inductance of the inductor $L_p$. Thus, such an arrangement is capable of calculating the capacitance L of the detection target 2 from the relation $L=1/\{L_r^{-1}+L_p^{-1}\}$.

With the measurement auxiliary circuit 11 configured as shown in FIG. 18, if the inductance of the detection target 2 is very large or otherwise is very small, this can excessively raise or lower the measurement sensitivity, leading to a risk of poor precision in the measurement of the inductance L. In order to solve such a problem, as shown in FIGS. 18B and 18C, an optimum topology may be selected for the measurement auxiliary circuit 11, and an optimum capacitance value may be selected for the inductance value $L_p$ or otherwise $L_s$, based on the inductance value L of the detection target 2. Thus, such a modification is capable of measuring the inductance value L with high precision.

Also, such an arrangement is capable of measuring the inductance of the detection target 2 by means of a parallel-resonance type measurement auxiliary circuit 11 shown in FIG. 17A. In this case, an inductor may be arranged in series or otherwise in parallel with the detection target 2.

Figure 19:
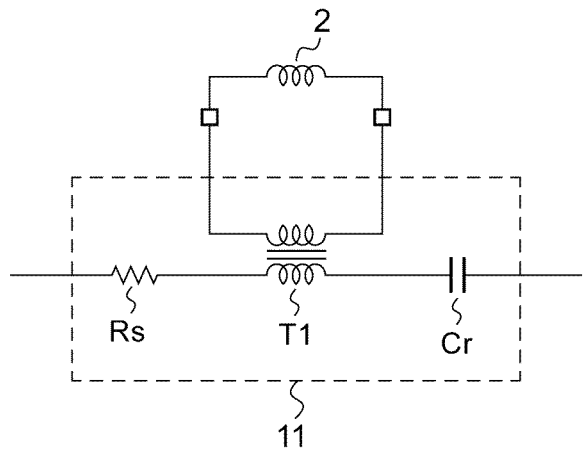
FIG. 19 is a circuit diagram showing a modification of the measurement auxiliary circuit.

FIG. 19 is a circuit diagram showing a modification of the measurement auxiliary circuit 11. The measurement auxiliary circuit 11 further includes a transformer T1. The measurement auxiliary circuit 11 is capable of measuring the inductance of the detection target 2, as with the measurement auxiliary circuit 11 shown in FIG. 18A. The primary coil $L_{r1}$ of the transformer T1 is connected in series with the resistor $R_s$ and the capacitor $C_r$. The secondary coil $L_{r2}$ of the transformer T1 is connected to the detection target 2. In a case in which the transformer T1 has a coupling coefficient κ=1, and in a case in which the relation $L_{r1}=L_{r2}$ holds true, the measurement auxiliary circuit 11 shown in FIG. 19 is represented by the same equivalent circuit as that of the measurement auxiliary circuit 11 shown in FIG. 18A. Such a modification has an advantage of DC separation of the detection target 2 from the measurement system.

Also, with such an impedance measurement apparatus 1, such an arrangement is capable of measuring the resistance value of the detection target 2.

[Usage of Impedance Measurement Apparatus 1]

Lastly, description will be made regarding the usage of the impedance measurement apparatus 1.

The impedance measurement apparatus 1 can be employed as an LCR meter configured to measure the values of an inductor L, a capacitor C, and a resistor R.

Figure 20:
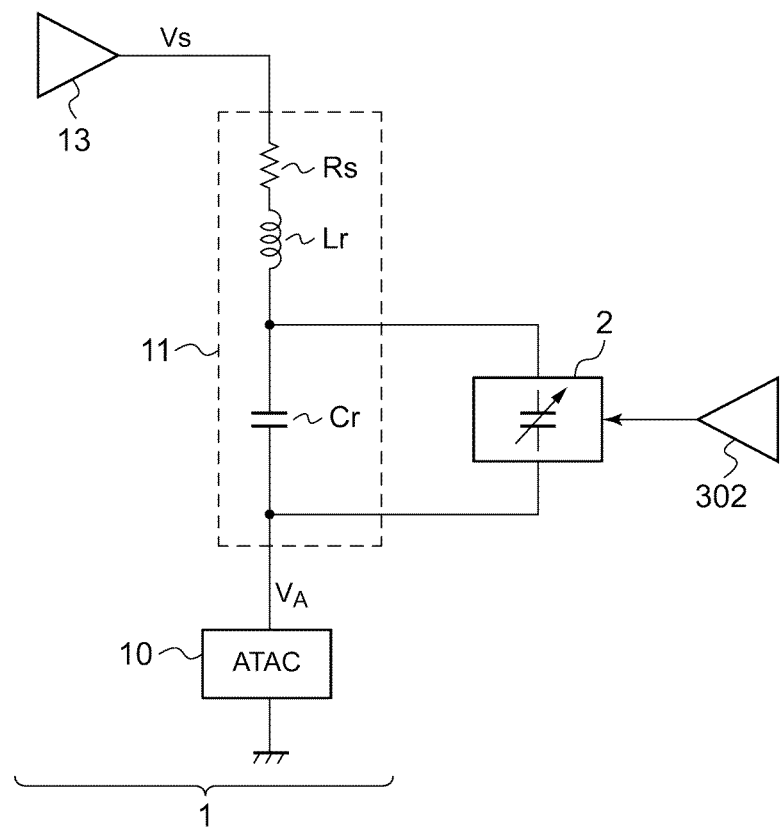
FIG. 20 is a diagram showing an acceleration sensor evaluation apparatus employing the impedance measurement apparatus.

FIG. 20 is a diagram showing an evaluation apparatus 300 employing the impedance measurement apparatus 1, configured to evaluate an acceleration sensor. The DUT (device under test) is an acceleration sensor using an electrostatic capacitance detection method configured to employ MEMS (Micro Electro Mechanical Systems). By measuring a change in the capacitance that occurs between a movable portion and a fixed portion, such an arrangement is capable of detecting acceleration.

The evaluation apparatus 300 further includes a vibration generator 302 in addition to the impedance measurement apparatus 1. The vibration generator 302 applies mechanical vibration to the DUT, thereby leading to a change in the variable capacitance. The impedance measurement apparatus 1 measures the change in the capacitance that occurs due to the vibration.

As another usage example, the impedance measurement apparatus 1 may be employed as an electrostatic capacitance sensor or a proximity sensor.

Figure 21A:
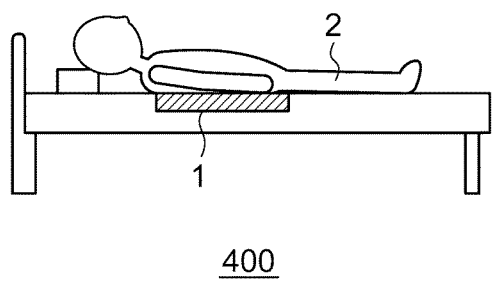
FIGS. 21A through 21C are diagrams respectively showing a vital signs monitor, a user interface apparatus, and a human body monitoring apparatus, each of which includes the impedance measurement apparatus.

FIG. 21A is a diagram showing a vital signs monitor including the impedance measurement apparatus 1. The vital signs monitor 400 includes the impedance measurement apparatus 1 mounted below a bed. The impedance measurement apparatus 1 is configured to detect a patient as the detection target 2. Specifically, the impedance measurement apparatus 1 detects the electrostatic capacitance that occurs due to the detection target 2, i.e., the patient.

Such a vital signs monitor 400 is capable of detecting whether or not the detection target 2 is on the bed. Furthermore, the impedance measurement apparatus 1 has a very high sensitivity. Thus, such an arrangement is capable of detecting a very small change in the electrostatic capacitance that occurs due to the detection target 2. In general, in a frequency range of 50 kHz or less, the tissue electroconductivity and the electrostatic capacitance of the human body change due to changes in the respiration and cardiac pulsation. Thus, with the vital signs monitor 400 employing the impedance measurement apparatus 1, by detecting the change in the electrostatic capacitance, such an arrangement is capable of measuring the respiration and cardiac pulsation of the patient in a contactless, unrestrained, and non-invasive manner.

Typically, conventional vital signs monitors each include a pressure sensor arranged below a bed, which has only a function of detecting whether or not the patient is on the bed. In contrast, the vital signs monitor 400 shown in FIG. 21A is capable of measuring the vital signs data of the patient, in addition to the presence or absence of the patient.

Figure 21B:
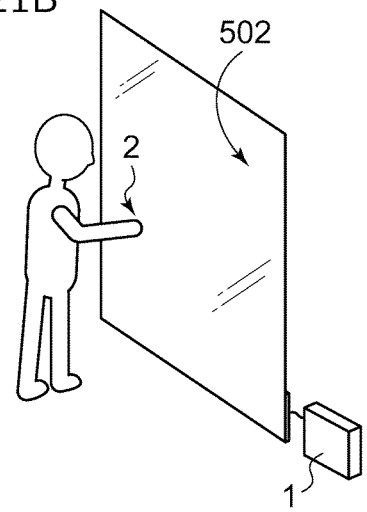

FIG. 21B is a diagram showing a user interface apparatus 500 including the impedance measurement apparatus 1. In the interface apparatus 500, the impedance measurement apparatus 1 includes a transparent electrode 502 mounted on a transparent window. When the user touches or approaches the transparent electrode 502, this leads to a change in the electrostatic capacitance generated at the transparent electrode 502. The impedance measurement apparatus 1 measures the electrostatic capacitance as the detection target 2, thereby detecting the motion of the user. The installation of the interface apparatus 500 does not require making a hole in a wall. Furthermore, with optical user interface apparatuses using infrared light which have been conventionally employed, such an arrangement is easily affected by environmental light in outdoor use, which is a problem. In contrast, the interface apparatus 500 shown in FIG. 21B can even be operated outdoors without such a problem.

Figure 21C:
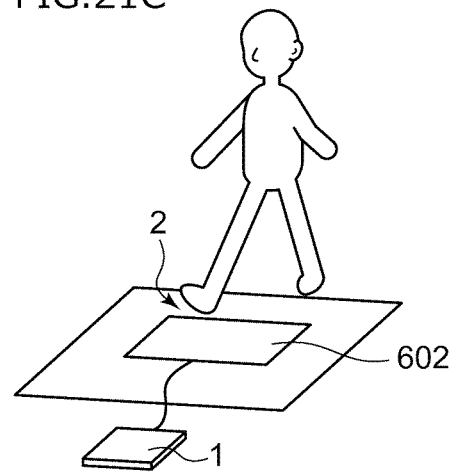

FIG. 21C is a diagram showing a human body monitoring apparatus 600 including the impedance measurement apparatus 1. The human body monitoring apparatus 600 includes an electrode 602 embedded in a floor. When a human body passes above the electrode 602, this leads to a change in the electrostatic capacitance generated at the electrode 602. The impedance measurement apparatus 1 measures the electrostatic capacitance as the detection target 2, thereby detecting the human body passing above the impedance measurement apparatus 1. Such a human body monitoring apparatus 600 is applicable to safety confirmation and also to security uses.

Figure 22:
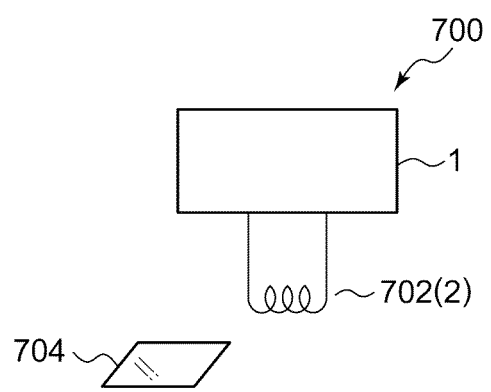
FIG. 22 is a magnetic field detection apparatus employing the impedance measurement apparatus.

The impedance measurement apparatus 1 can be employed in a magnetic field detection apparatus. FIG. 22 is a magnetic field detection apparatus 700 including the impedance measurement apparatus 1. The magnetic field detection apparatus 700 includes the aforementioned impedance measurement apparatus 1 and a pickup coil 702. With the magnetic field detection apparatus 700, the combination of the pickup coil 702 and the electrical/magnetic environment (e.g., the presence or absence of a piece of metal 704) around the pickup coil 702 corresponds to the detection target 2 shown in FIGS.

18A through 18C. The magnetic field detection apparatus 700 can be employed as a metal detector, as a sensor configured to detect a small amount of magnetic fluid, and as a sensor configured to detect a change in magnetic coupling and a change in magnetic permeability.

FIGS. 23A through 23E are diagrams each showing a pickup coil 702 suitable for the magnetic field detection apparatus 700.

FIG. 23A shows a pickup coil 702 having a typical configuration. FIG. 23B shows a pickup coil 702 including three coils arranged such that they are orthogonal to each other, thereby allowing a magnetic field to be detected in the form of a vector. FIGS. 23C through 23E each show a pickup coil 702 configured as a gradiometer including two or otherwise three coils connected with respectively reverse polarities. FIGS. 23C and 23D each show a first-order gradiometer configuration. FIG. 23E shows a second-order gradiometer configuration. In particular, in a case of employing such a gradiometer configuration shown in FIGS. 23C through 23E, such a combination of the gradiometer configuration and the impedance measurement apparatus 1 provides, as a synergistic effect, dramatically high-sensitivity detection of a magnetic field.

With the magnetic field detection apparatus 700 employing the impedance measurement apparatus 1, the ATAC is capable of maintaining the magnetic field generating coil in a state which is equivalent to the resonance state. Thus, such an arrangement allows energy loss due to heat generation to be reduced, which is an important advantage provided by the magnetic field detection apparatus 700 employing the impedance measurement apparatus 1. Thus, with such an arrangement, it becomes possible to provide the magnetic field detection apparatus 700 in the form of a battery-driven portable device.

The magnetic field detection apparatus 700 may be employed as a sensor used in sentinel lymph node navigation surgery for detecting the metastasis of breast cancer. Also, the magnetic field detection apparatus 700 is capable of detecting, in a non-destructive manner, a metal pipe, gas pipe, or water pipe which is embedded in a wall or otherwise in the ground.

While the preferred embodiments of the present invention have been described using specific terms, such description is for illustrative purposes only, and it is to be understood that changes and variations may be made without departing from the spirit or scope of the appended claims.

What is claimed is:

1. An impedance measurement apparatus configured to measure an impedance of a detection target, the impedance measurement apparatus comprising:
   a measurement auxiliary circuit configured to form a resonance circuit together with the detection target;
   an automatic tuning assist circuit coupled with the resonance circuit, and comprising (i) a first terminal and a second terminal, (ii) N (N represents an integer) auxiliary capacitors, (iii) a plurality of switches, each of which is arranged between two terminals from among the first terminal, the second terminal, and terminals of the N auxiliary capacitors, and (iv) a controller configured to respectively switch each of the plurality of switches;
   a signal generator configured to apply an AC probe signal to the resonance circuit; and
   an impedance detection unit configured to measure a voltage at least one node and/or a current that flows through at least one current path after the impedance measurement apparatus enters a stable state, and to detect the impedance of the detection target based on the measurement value.

2. The impedance measurement apparatus according to claim 1, wherein the impedance detection unit is configured to detect the impedance of the detection target based on a capacitor voltage that occurs across at least one auxiliary capacitor included in the automatic tuning assist circuit.

3. The impedance measurement apparatus according to claim 1, wherein the N auxiliary capacitors include a first auxiliary capacitor,
   and wherein the plurality of switches includes a first switch and a second switch,
   and wherein the first switch and the first auxiliary capacitor are arranged in series between the first terminal and the second terminal,
   and wherein the second switch is arranged between the first terminal and the second terminal such that it is arranged in parallel with a circuit comprising the first switch and the first auxiliary capacitor.

4. The impedance measurement apparatus according to claim 3, wherein the N auxiliary capacitors further include a second auxiliary capacitor,
   and wherein the second auxiliary capacitor is arranged between the first terminal and the second terminal such that it is arranged in series with the second switch.

5. The impedance measurement apparatus according to claim 1, wherein the plurality of switches includes a first switch, a second switch, a third switch, and a fourth switch,
   and wherein the N auxiliary capacitors include a first auxiliary capacitor,
   and wherein the first switch and the second switch are arranged in series between the first terminal and the second terminal,
   and wherein the third switch and the fourth switch are sequentially arranged in series between the first terminal and the second terminal such that they are arranged on a path which is in parallel with a circuit comprising the first switch and the second switch,
   and wherein the first auxiliary capacitor is arranged between a connection node that connects the first switch and the second switch and a connection node that connects the third switch and the fourth switch.

6. An impedance measurement apparatus configured to measure an impedance of a detection target, the impedance measurement apparatus comprising:
   a measurement auxiliary circuit configured to form a resonance circuit together with the detection target;
   an automatic tuning assist circuit coupled with the resonance circuit, and comprising (i) N (N represents an integer) auxiliary capacitors, (ii) a plurality of switches configured to charge and discharge the N auxiliary capacitors using a current that flows through the resonance circuit, (iii) a controller configured to respectively switch on and off each of the plurality of switches so as to generate a capacitor voltage across both ends of each of the N auxiliary capacitors, and to apply an auxiliary voltage to the resonance circuit according to the capacitor voltages generated across the N auxiliary capacitors;
   a signal generator configured to apply an AC probe signal to the resonance circuit; and
   an impedance detection unit configured to measure a voltage at least one node as well as or otherwise a current that flows through at least one current path after the impedance measurement apparatus enters a stable state, and to detect the impedance of the detection target based on the measurement value.

7. The impedance measurement apparatus according to claim 6, wherein the impedance detection unit is configured to detect the impedance of the detection target based on a capacitor voltage that occurs across at least one auxiliary capacitor.

8. An impedance measurement apparatus configured to measure an impedance of a detection target, the impedance measurement apparatus comprising:
   a measurement auxiliary circuit configured to form a resonance circuit together with the detection target;
   an automatic tuning assist circuit coupled with the resonance circuit, configured to inject a correction current into, or otherwise draw a correction current from, the resonance circuit, and comprising (i) a first terminal and a second terminal, (ii) N (N represents an integer) auxiliary coils, (iii) a plurality of switches arranged between two terminals from among the first terminal, the second terminal, and terminals of the N auxiliary coils, and (iv) a controller configured to respectively switch on and off each of the plurality of switches;
   a signal generator configured to apply an AC probe signal to the resonance circuit; and
   an impedance detection unit configured to measure a voltage at at least one node as well as or otherwise a current that flows through at least one current path after the impedance measurement apparatus enters a stable state, and to detect the impedance of the detection target based on the measurement value.

9. The impedance measurement apparatus according to claim 8, wherein the impedance detection unit is configured to detect the impedance of the detection target based on an auxiliary current that flows through at least one auxiliary coil included in the automatic tuning assist circuit.

10. The impedance measurement apparatus according to claim 8, wherein the plurality of switches includes a first switch and a second switch,
   and wherein the N auxiliary coils include a first auxiliary coil,
   and wherein the first switch and the first auxiliary coil are arranged in series between the first terminal and the second terminal,
   and wherein the second switch is arranged in parallel with the first auxiliary coil.

11. The impedance measurement apparatus according to claim 8, wherein the plurality of switches includes a first switch, a second switch, a third switch, and a fourth switch,
   and wherein the N auxiliary coils include a first auxiliary coil and a second auxiliary coil,
   and wherein the first switch and the first auxiliary coil are arranged in series between the first terminal and the second terminal,
   and wherein the second switch is arranged in parallel with the first auxiliary coil,
   and wherein the third switch and the second auxiliary coil are arranged in series between the first terminal and the second terminal,
   and wherein the fourth switch is arranged in parallel with the second auxiliary coil.

12. The impedance measurement apparatus according to claim 8, wherein the plurality of switches includes a first switch, a second switch, a third switch, and a fourth switch,
   and wherein the N auxiliary coils include a first auxiliary coil,
   and wherein the first switch and the second switch are arranged in series between the first terminal and the second terminal,
   and wherein the third switch and the fourth switch are arranged in series between the first terminal and the second terminal such that they are arranged in parallel with a circuit comprising the first switch and the second switch,
   and wherein the first auxiliary coil is arranged between a connection node that connects the first switch and the second switch and a connection node that connects the third switch and the fourth switch.

13. An impedance measurement apparatus configured to measure an impedance of a detection target, the impedance measurement apparatus comprising:
   a measurement auxiliary circuit configured to form a resonance circuit together with the detection target;
   an automatic tuning assist circuit comprising an auxiliary coil, and configured to alternately switch between (1) a first state in which the auxiliary coil is coupled with the resonance circuit such that a correction current that corresponds to a current that flows through the auxiliary coil is injected into, or otherwise is drawn from, the resonance circuit, and (2) a second state in which the auxiliary coil is disconnected from the resonance circuit such that the current that flows through the auxiliary coil flows through a current path that is independent of the resonance circuit;
   a signal generator configured to apply an AC probe signal to the resonance circuit; and
   an impedance detection unit configured to measure a voltage at least one node as well as or otherwise a current that flows through at least one current path after the impedance measurement apparatus enters a stable state, and to detect the impedance of the detection target based on the measurement value.

14. The impedance measurement apparatus according to claim 13, wherein the impedance detection unit is configured to detect the impedance of the detection target based on a current that flows through at least one auxiliary coil included in the automatic tuning assist circuit.

* * * * *